United States Patent
Sera et al.

(10) Patent No.: US 7,027,109 B2
(45) Date of Patent: Apr. 11, 2006

(54) TFT ARRAY SUBSTRATE AND ACTIVE-MATRIX ADDRESSING LIQUID-CRYSTAL DISPLAY DEVICE

(75) Inventors: Kenji Sera, Tokyo (JP); Fujio Okumura, Tokyo (JP)

(73) Assignee: NEC Corporation, Tokyo (JP)

( * ) Notice: Subject to any disclaimer, the term of this patent is extended or adjusted under 35 U.S.C. 154(b) by 129 days.

(21) Appl. No.: 10/209,870

(22) Filed: Aug. 2, 2002

(65) Prior Publication Data

US 2003/0025848 A1   Feb. 6, 2003

(30) Foreign Application Priority Data

Aug. 3, 2001   (JP) .............................. 2001-235699

(51) Int. Cl.
G02F 1/136    (2006.01)
(52) U.S. Cl. .............................. 349/44; 349/41; 349/42; 349/43; 349/110; 349/111
(58) Field of Classification Search ............ 349/41–44, 349/110
See application file for complete search history.

(56) References Cited

U.S. PATENT DOCUMENTS 5,790,222 A * 8/1998 Kim ............................ 349/139

FOREIGN PATENT DOCUMENTS

| CN | 1205087 A | 1/1999 |
|----|-----------|--------|
| JP | 4-152574 | 5/1992 |
| JP | 6-160899 | 6/1994 |
| JP | 11-84422 | 3/1999 |
| JP | 2000-10120 | 1/2000 |
| JP | 2000-131716 | 5/2000 |
| JP | A 2000-180899 | 6/2000 |
| JP | A 2000-356787 | 12/2000 |
| JP | 2001-075504 | 3/2001 |
| JP | 2001-330856 | 11/2001 |
| JP | 2002-108248 | 4/2002 |
| JP | 2002149089 | 5/2002 |

\* cited by examiner

Primary Examiner—Andrew Schechter
Assistant Examiner—George Y. Wang
(74) Attorney, Agent, or Firm—Young & Thompson

(57) ABSTRACT

A TFT array substrate blocks light traveling toward active layers of the TFTs. A patterned first light-shielding layer is formed between a transparent plate and TFTs to overlap with the active layers of the TFTs. A patterned third light-shielding layer is formed to cover the TFTs on the opposite side to the plate with respect to the TFTs. The third light-shielding layer has the first parts extending along rows of the matrix and the second parts extending along the columns thereof. A patterned second light-shielding layer is formed between the first light-shielding layer and the TFTs. The second light-shielding layer has a light-absorbing property, which absorbs the light entering the inside of the substrate. A patterned fourth light-shielding layer may be additionally provided between the TFTs and the third light-shielding layer.

25 Claims, 26 Drawing Sheets

US 7,027,109 B2

TFT ARRAY SUBSTRATE AND ACTIVE-MATRIX ADDRESSING LIQUID-CRYSTAL DISPLAY DEVICE

BACKGROUND OF THE INVENTION

1. Field of the Invention

The present invention relates generally to Liquid-Crystal Display (LCD) devices. More particularly, the invention relates to a substrate on which Thin-Film Transistors (TETs) are arranged in a matrix array, i.e., a TFT array substrate, and an active-matrix addressing LCD device equipped with the substrate. This substrate and device are preferably applicable to the light bulb of the projection type display device.

2. Description of the Related Art

In recent years, various types of display devices applicable to wall-hung type televisions (TVs), projection type TVs, or Office Automation (OA) equipment have been developed. To realize high-grade display devices for OA equipment or high-definition TVs (HDTVs), active-matrix addressing LCD devices utilizing TFTs as their switching elements are more promising within the conventional display devices. This is because active-matrix LCD devices have an advantage that contrast and response speed do not degrade even if the count of the scan lines is increased. Moreover, active-matrix LCD devices have another advantage that a large-sized display screen can be easily realized if they are used as the light bulb of projection-type display devices.

With the LCD device designed for the light bulb, normally, high-luminance light is inputted into the LCD device from a light source and then, the light thus inputted is controlled according to the image information while the light passes through the same device. In other words, the intensity of the light transmitted through the device is adjusted by changing the transmittance of the individual pixels by application of electric field to the respective pixels while driving the TFTs. The light passed through the device is then enlarged and projected onto a large screen by way of a projection light system including specific lenses.

The light source is located on the opposite substrate side of the LCD device while the projection light system is on the TFT-array substrate side. Thus, not only the light emitted from the light source but also the light reflected by the projection light system will enter the device.

With the active-matrix addressing LCD device, a layer of semiconductor such as amorphous silicon or polysilicon (i.e., a semiconductor layer) is used for the active layer of each TFT. If light is irradiated to the active layer, current leakage will be induced due to optical excitation. On the other hand, as described previously, high-luminance light is inputted into the LCD device for the light bulb and thus, the current leakage will be large. Since, in addition to the light from the source, the reflected light by the projection light system is irradiated to the active layer, the current leakage is likely to be larger.

Recently, there is a tendency that the projection type LCD device is designed to be more compact and to have higher luminance. Thus, the luminance of the light inputted into the device tends to be higher. From this point of view, the above-described problem about the current leakage will be more serious. To solve this problem, with prior-art active-matrix addressing LCD devices for the light bulb, light-shielding layers are provided to prevent the light from irradiating to the active layers of the TFTs.

FIG. 1 and FIGS. 2A and 2B show the schematic configuration of the TFT array substrate 100 of a prior-art LCD device of this type, in which only one pixel is illustrated for simplification. FIG. 1 is a partial plan view of the substrate 100, FIG. 2A is a cross-sectional view along the line IIA—IIA in FIG. 1, and FIG. 2B is a cross-sectional view along the line IIB—IIB in FIG. 1. These figures show the structure of one pixel, because all the pixels have the same structure.

The prior-art TFT array substrate 100 comprises a transparent plate 101, on which TFTs 131 are arranged in a matrix array. A lower light-shielding layer 103, which is made of tungsten silicide ($WSi_2$), is formed over the plate 101 by way of a silicon dioxide ($SiO_2$) layer 102. The plan shape of the lower light-shielding layer 103 is like a lattice, which is formed by lateral strips extending along the rows (the X direction in FIG. 1) of the matrix of the TFTs 131 and vertical strips extending along the columns (the Y direction in FIG. 1) thereof and intersecting with the lateral ones. The whole layer 103 is covered with an overlying $SiO_2$ layer 104.

Patterned polysilicon layers 107, which serve as the active layers of the TFTs 131, are formed on the $SiO_2$ layer 104. Each of the layers 107 has a plan shape like L.

Each of the polysilicon active layers 107 comprises an undoped channel region 107c, two lightly-doped LDD (Lightly-Doped Drain) regions 107b and 107d, a heavily-doped source region 107a, and a heavily-doped drain region 107e. The source and drain regions 107a and 107e are located at each side of the channel region 107c. The LDD region 107b is located between the source region 107a and the channel region 107c. The LDD region 107d is located between the channel region 107c and the drain region 107e.

The source region 107a, the LDD region 107b, the channel region 107c, the LDD region 107d, and the drain region 107e are arranged along the Y direction in such a way as to overlap with the lower light-shielding layer 103. Part of the drain region 107e is extended in the X direction.

A gate dielectric layer 108 is formed on the $SiO_2$ layer 104 to cover the underlying active layers 107.

Gate lines 109, which are made of impurity-doped polysilicon or silicide, are formed on the gate dielectric layer 108. These lines 109 are parallel to each other and extend in the X direction. Each of the lines 109 is located to overlap with the channel regions 107c of the TFTs 131 that belong to the same row of the matrix. The parts of the line 109 placed right over the regions 107c serve as gate electrodes of the corresponding TFTs 131. The lines 109 are entirely covered with a first interlayer dielectric layer 110.

Data lines 111, which are made of aluminum (Al), are formed on the first interlayer dielectric layer 110. These lines 111 are parallel to each other and extend in the Y direction. Each of the lines 111 is located to overlap with the active layers 107 of the TFTs 131 that belong to the same column of the matrix. The line 111 covers entirely the source regions 107a, the channel regions 107c, and the LDD regions 107b and 107d of the corresponding TFTs 131. The line 111 covers parts of the drain regions 107e of the corresponding TFTs 131, The line 111 is mechanically contacted with and electrically connected to the source regions 107a of the TFTs 131 that belong to the same row of the matrix by way of contact holes 121 that penetrate the first interlayer dielectric layer 110 and the gate dielectric layer 105. The lines 111 are entirely covered with a second interlayer dielectric layer 112.

A patterned black matrix layer 113, which is made of chromium (Cr), is formed on the second interlayer dielectric layer 112. The plan shape of the layer 113 is like a lattice, which is formed by lateral strips extending along the rows (the X direction in FIG. 1) of the matrix and vertical strips extending along the columns (the Y direction in FIG. 1) thereof and intersecting with the lateral ones. The layer 113 is patterned to overlap with the gate lines 109 and the data lines 111 and to cover the TFTs 131. The layer 113 serves as an upper light-shielding layer. The layer 113 is entirely covered with a third interlayer dielectric layer 114.

Pixel electrodes 115, which have an approximately rectangular plan shape, are formed on the third interlayer dielectric layer 114 The electrodes 115 are located in corresponding pixel areas 120 defined by the gate lines 109 and the data lines 111. The electrodes 115 are mechanically contacted with and electrically connected to the drain regions 107e of the corresponding TFTs 131 by way of contact holes 122 that penetrate the third interlayer dielectric layer 114, the second interlayer dielectric layer 112, the first interlayer dielectric layer 110, and the gate dielectric layer 108.

With a prior-art LCD device including the prior-art TFT array substrate 100 having the above-described structure, an opposite substrate (not shown) is coupled with the substrate 100 to form a liquid-crystal layer between these two substrates. The light entering the LCD device from the side of the opposite substrate is blocked by the black matrix layer (i.e., the upper light-shielding layer) 113. The light entering from the side of the TFT array substrate 100 is blocked by the lower light-shielding layer 103. However, there is a problem that the light entering from the side of the substrate 100 is unable to prevent sufficiently from being irradiated to the LDD regions 107b and 107b and/or the channel region 107c of the TFT 131. This is explained in more detail below with reference to FIG. 3.

As shown in FIG. 3, the light L101 entering the LCD device from the side of the opposite substrate is blocked by the black matrix layer (i.e., the upper light-shielding layer) 113. Alternately, the light L101 penetrates the substrate 100 without reflection by the lower light-shielding layer 103. This is because the widths of the layers 113 and 103 and the interval between the layers 113 and 103 are well adjusted for this purpose. The light L102 entering the LCD device from the side of the substrate 100 is blocked by the lower light-shielding layer 103.

However, as seen from FIG. 3, the light L103 entering the LCD device from the side of the TFT array substrate 100 toward the black matrix layer 113 is reflected by the layer 113 to go to the lower light shielding layer 103. Then, the light L103 travels the space between the layer 103 and the data line 111 through multiple reflections and finally, it reaches the LDD region 107b. Moreover, the light L104 entering the LCD device from the side of the substrate 100 toward the data line 111 travels the space between the layer 103 and the data line 111 through multiple reflections and finally, it reaches the LDD region 107b. Similarly, light is irradiated to the LDD region 107d after multiple reflections. Practically, various light including the light L103 and L104 enters from the side of the substrate 100 and thus, the light is irradiated to the channel region 107c.

To avoid this problem, various improvements have ever been developed and disclosed.

For example, the Japanese Non-Examined Patent Publication No. 2000-180899 published in June 2000 discloses a LCD device, in which the ends of the lower light-shielding layer are tapered to form a trapezoidal cross section. In this device, if the width of the lower light-shielding layer and the width of the data line are well adjusted, light entering the LCD device from the side of the TFT array substrate is blocked by the lower light-shielding layer and thus, the light is prevented from being irradiated to the channel region.

The Japanese Non-Examined Patent Publication No. 2000-356787 published in December 2000 discloses a LCD device, in which dummy contact holes are formed near the channel region in the dielectric layer that covers the lower light-shielding layer. The dummy contact holes are filled with a wiring material. In this device, the wiring material filled in the dummy contact holes block the light entering the LCD device from the side of the TFT array substrate and thus, the light is prevented from being irradiated to the channel region.

Additionally, as known well, the black matrix layer may be placed on the TFT array substrate or the opposite substrate. If the black matrix layer is placed on the opposite substrate, an alignment error (i.e., allowance) of approximately 10 µm needs to be considered in advance in the coupling process of the TFT array substrate and the opposite substrate, while taking the typical overlay accuracy between these two substrates into consideration. As a result, the black matrix layer needs to be larger in width. This leads to a disadvantage that the aperture ratio is unable to be increased.

Unlike this, if the black matrix layer is placed on the TFT array substrate, the alignment accuracy between the black matrix layer and the TFTs can be raised by utilizing the known fabrication processes of semiconductor devices. Therefore, as shown in FIGS. 1, 2A, and 2B, this structure is becoming a main stream.

As explained above, with the prior-art LCD device having the prior-art TFT array substrate 100 of FIGS. 1 and 2A to 2B, part of the light entering the LCD device from the side of the substrate 100 is likely to reach the LDD regions 107b and 107d and/or the channel region 107c. Thus, optically induced current leakage increases and as a result, a problem of degradation of contrast and non-uniformity of image quality occurs.

With the LCD device disclosed by the Publication No. 2000-180899, the process step of forming the tapered ends of the lower light-shielding layer is required. Therefore, there is a problem that the fabrication processes are complicated.

With the LCD device disclosed by the Publication No. 2000-356787, the process step of forming the dummy contact holes near the channel region in the dielectric layer that covers the lower light-shielding layer and the process step of filing the dummy contact holes with the wiring material. Therefore, there is a problem that the fabrication processes are complicated, which is the same as that of the Publication No. 2000-180899.

Furthermore, with the LCD devices disclosed by the Publication Nos. 2000-180899 and 2000-356787, if these devices are applied to the light bulb for high-luminance projection-type display devices, it is difficult to effectively and sufficiently block the light traveling toward the active layer of the TFT.

SUMMARY OF THE INVENTION

Accordingly, an object of the present invention is to provide a TFT array substrate and a LCD device that block effectively block the light traveling toward the active layers of the TFTs.

Another object of the present invention is to provide a TFT array substrate and a LCD device that suppress the optically induced current leakage in the TFTs.

Still another object of the present invention is to provide a TFT array substrate and a LCO device that improve the contrast and uniformity of image quality.

A further object of the present invention is to provide a TFT array substrate and a LCD device that can be fabricated easily without complicated process steps.

The above objects together with others not specifically mentioned will become clear to those skilled in the art from the following description.

According to a first aspect of the invention, a TFT array substrate is provided, which comprises:

(a) a transparent plate;
(b) TFTs arranged on the plate in a matrix array with rows and columns;
   each of the TFTs having a first source/drain region, a second source/drain region, and an active layer;
(c) gate lines formed on the plate in such a way as to extend along the rows of the matrix:
(d) data lines formed on the plate in such a way as to extend along the columns of the matrix;
   each of the data lines being electrically connected to corresponding ones of the TFTs at their first source/drain regions;
(e) pixel electrodes formed in pixel areas on the plate;
   each of the pixel electrodes being electrically connected to corresponding ones of the TFTs at their second source/drain regions;
(f) a patterned first light-shielding layer formed between the plate and the TFTs in such a way as to overlap with the active layers of the TFTs;
(g) a patterned second light-shielding layer formed between the first light-shielding layer and the TFTs;
   the second light-shielding layer having a light-absorbing property;
(h) a patterned third light-shielding layer formed to cover the TFTs on an opposite side to the plate with respect to the TFTs:
   the third light-shielding layer having first parts extending along the rows of the matrix and second parts extending along the columns thereof.

With the TFT array substrate according to the first aspect of the invention, the patterned first light-shielding layer is formed between the plate and the TFTs in such a way as to overlap with the active layers of the TFTs. The patterned third light-shielding layer is formed to cover the TFTs on the opposite side to the plate with respect to the TFTs. The third light-shielding layer has the first parts extending along the rows of the matrix and the second parts extending along the columns thereof. Moreover, the patterned second light-shielding layer is formed between the first light-shielding layer and the TFTs. The second light-shielding layer has a light-absorbing property.

Therefore, even if light entering the inside of the TFT array substrate from the side of the plate is reflected by the third patterned light-shielding layer and/or the data lines and then, it is reflected by the first patterned light-shielding layer, the whole reflected light will reach the patterned second light-shielding layer. Since the second light-shielding layer has a light-absorbing property, the reflected light will be absorbed by the second light-shielding layer. Thus, any light traveling toward the active layers of the TFTs in the TFT array substrate is effectively blocked. This means that the active layers are not exposed to the light. As a result, the optically induced current leakage in the TFTs is suppressed, thereby improving the contrast and uniformity of image quality.

Moreover, the complicated fabrication process steps as disclosed in the Japanese Non-Examined Patent Publication Nos. 2000-180899 and 2000-356787 are unnecessary. Thus, the TFT array substrate can be fabricated easily without complicated process steps.

In a preferred embodiment of the substrate according to the first aspect of the invention, each of the TFTs has a channel region and a LDD region. The second light-shielding layer has first parts covering the channel regions of the TFTs and second parts covering the LDD regions thereof. In this embodiment, there is an additional advantage that the light traveling toward the channel regions and the LDD regions is certainly blocked. In general, irradiation of light to the channel region or the LDD region will induce current leakage. Thus, current leakage can be effectively reduced by blocking or suppressing the light.

In another preferred embodiment of the substrate according to the first aspect of the invention, the second light-shielding layer is made of a material including silicon. More preferably, the second light-shielding layer is made of silicon. In this embodiment, there is an additional advantage that current leakage is suppressed more efficiently.

In still another preferred embodiment of the substrate according to the first aspect of the invention, the second light-shielding layer has conductivity. The second light-shielding layer has a structure that allows application of a constant voltage. In this embodiment, there is an additional advantage that the second light-shielding layer can be biased at a desired potential and that the characteristic of the TFT can be controlled.

In a further preferred embodiment of the substrate according to the first aspect of the invention, the second light-shielding layer has conductivity and is connected electrically to the gate lines. In this embodiment, there is an additional advantage that the TFTs have a dual-gate structure having an improved on/off characteristic.

In still further preferred embodiment of the substrate according to the first aspect of the invention, the second light-shielding layer is made of silicon doped with an impurity. In this embodiment, there is an additional advantage that desired conductivity can be easily given to the second light-shielding layer.

Preferably, the gate lines are arranged in such a way as to overlap with the channel regions of the corresponding TFTs. The gate lines have a function of gate electrodes of the TFTs at their overlapping parts.

Preferably, gate electrodes are formed for the respective TFTs separately from the gate lines. The gate lines are electrically connected to the corresponding gate electrodes.

In still further preferred embodiment of the substrate according to the first aspect of the invention, a dielectric sandwiched by the second light-shielding layer and the active layers of the TFTs has a thickness ranging from 100 nm to 500 nm. In this embodiment, the light shielding effect of the invention is ensured. More preferably, the dielectric thickness ranges from 150 nm to 300 nm. In this case, the light-shielding effect of the invention is enhanced.

In still further preferred embodiment of the substrate according to the first aspect of the invention, a driver circuit section including TFTs is provided in addition to a pixel matrix section where the TFTs are arranged in a matrix array. The second light-shielding layer is provided for the TFTs in the pixel matrix section while the second light-shielding layer is not provided for the TFTs in the driver circuit section. In this embodiment, the second light-shielding layer is provided for the TFTs in the pixel matrix section and the second light-shielding layer is not provided for the TFTs in the driver circuit section. Therefore, if laser light is irradiated to amorphous silicon layers designed for the active layers of the TFTs in the pixel matrix section and the driver circuit section in a laser annealing process, the laser-inducing heat will propagate more quickly into the vicinities of the amorphous silicon layers by way of the second light-shielding layer in the pixel matrix section than that in the driver circuit section. As a result, the amorphous silicon layers in the pixel matrix section are turned to polysilicon layers with low crystallinity. This means that optically induced current leakage is further suppressed. At the same time as this, the amorphous silicon layers in the driver circuit section are turned to polysilicon layers with high mobility.

According to a second aspect of the invention, an active-matrix addressing LCD device is provided, which comprises:
(a) the TFT array substrate according to the first aspect;
(b) an opposite substrate located to be opposite to the TFT array substrate; and
(c) a liquid-crystal layer formed between the TFT array substrate and the opposite substrate.

With the active-matrix addressing LCD device according to the second aspect of the invention, the same advantages as those shown in the TFT array substrate according to the first aspect of the invention are obtainable because of the same reason as above.

According to a third aspect of the invention, another TFT array substrate is provided, which comprises:
(a) a transparent plate;
(b) TFTs arranged on the plate in a matrix array with rows and columns;
each of the TFTs having a first source/drain region, a second source/drain region, and an active layer;
(c) gate lines formed on the plate in such a way as to extend along the rows of the matrix;
(d) data lines formed on the plate in such a way as to extend along the columns of the matrix;
each of the data lines being electrically connected to corresponding ones of the TFTs at their first source/drain regions;
(e) pixel electrodes formed in pixel areas on the plate;
each of the pixel electrodes being electrically connected to corresponding ones of the TFTs at their second source/drain regions;
(f) a patterned first light-shielding layer formed between the plate and the TFTs in such a way as to overlap with the active layers of the TFTs;
(g) a patterned third light-shielding layer formed to cover the TFTs on an opposite side to the plate with respect to the TFTs;
the third light-shielding layer having first parts extending along the rows of the matrix and second parts extending along the columns thereof; and
(h) a patterned fourth light-shielding layer formed between the TFTs and the third light-shielding layer;
the fourth light-shielding layer having a light-absorbing property.

With the TFT array substrate according to the third aspect of the invention, the patterned first light-shielding layer is formed between the plate and the TFTs in such a way as to overlap with the active layers of the TFTs. The patterned third light-shielding layer is formed to cover the TFTs on the opposite side to the plate with respect to the TFTs. The third light-shielding layer has the first parts extending along the rows of the matrix and the second parts extending along the columns thereof. Moreover, the patterned fourth light-shielding layer is formed between the TFTs and the third light-shielding layer. The fourth light-shielding layer has a light-absorbing property.

Therefore, even if light entering the inside of the TFT array substrate from the side of the plate is reflected by the third patterned light-shielding layer and/or the data lines and then, it is reflected by the first patterned light-shielding layer, the whole reflected light will reach the patterned fourth light-shielding layer. Since the fourth light-shielding layer has a light-absorbing property, the reflected light will be absorbed by the fourth light-shielding layer. Thus, any light traveling toward the active layers of the TFTs in the TFT array substrate is effectively blocked. This means that the active layers are not exposed to the light. As a result, the optically induced current leakage in the TFTs is suppressed, thereby improving the contrast and uniformity of image quality.

Moreover, the complicated fabrication process steps as disclosed in the Japanese Non-Examined Patent Publication Nos. 2000-180899 and 2000-356787 are unnecessary. Thus, the TFT array substrate can be fabricated easily without complicated process steps.

In a preferred embodiment of the substrate according to the third aspect of the invention, each of the TFTs has a channel region and a LDD region. The second light-shielding layer has first parts covering the channel regions of the TFTs and second parts covering the LDD regions thereof. In this embodiment, there is an additional advantage that the light traveling toward the channel regions and the LDD regions is certainly blocked. In general, irradiation of light to the channel region or the LDD region will induce current leakage. Thus, current leakage can be effectively reduced by blocking or suppressing the light.

In another preferred embodiment of the substrate according to the third aspect of the invention, the fourth light-shielding layer is made of a material including silicon. More preferably, the fourth light-shielding layer is made of silicon. In this embodiment, there is an additional advantage that current leakage is suppressed more efficiently.

In still another preferred embodiment of the substrate according to the third aspect of the invention, the fourth light-shielding layer has conductivity. The fourth light-shielding layer has a structure that allows application of a constant voltage. In this embodiment, there is an additional advantage that the fourth light-shielding layer can be biased at a desired potential and that the characteristic of the TFT can be controlled.

In a further preferred embodiment of the substrate according to the third aspect of the invention, the fourth light-shielding layer has conductivity and is connected electrically to the gate lines.

In still further preferred embodiment of the substrate according to the third aspect of the invention, the fourth light-shielding layer is made of silicon doped with an impurity. In this embodiment, there is an additional advantage that desired conductivity can be easily given to the fourth light-shielding layer.

Preferably, the gate lines are arranged in such a way as to overlap with the channel regions of the corresponding TFTs. The gate lines have a function of gate electrodes of the TFTs at their overlapping parts.

Preferably, gate electrodes are formed for the respective TFTs separately from the gate lines. The gate lines are electrically connected to the corresponding gate electrodes.

In still further preferred embodiment of the substrate according to the third aspect of the invention, a patterned second light-shielding layer is additionally formed between the first light-shielding layer and the TFTs, The second light-shielding layer has a light-absorbing property. In this embodiment, the light is blocked at each side of the TFTs and therefore, very high light-shielding effect is obtainable.

In still further preferred embodiment of the substrate according to the third aspect of the invention, a dielectric sandwiched by the second light-shielding layer and the active layers of the TFTs has a thickness ranging from 100 nm to 500 nm. In this embodiment, the light shielding effect of the invention is ensured. More preferably, the dielectric thickness ranges from 150 nm to 300 nm. In this case, the light shielding effect of the invention is enhanced.

In still further preferred embodiment of the substrate according to the third aspect of the invention, a driver circuit section including TFTs is provided in addition to a pixel matrix section where the TFTs are arranged in a matrix array. The second light-shielding layer is provided for the TFTs in the pixel matrix section while the second light-shielding layer is not provided for the TFTs in the driver circuit section. In this embodiment, the second light-shielding layer is provided for the TFTs in the pixel matrix section and the second light-shielding layer is not provided for the TFTs in the driver circuit section. Therefore, if laser light is irradiated to amorphous silicon layers designed for the active layers of the TFTs in the pixel matrix section and the driver circuit section in a laser annealing process, the laser-inducing heat will propagate more quickly into the vicinities of the amorphous silicon layers by way of the second light-shielding layer in the pixel matrix section than that in the driver circuit section. As a result, the amorphous silicon layers in the pixel matrix section are turned to polysilicon layers with low crystallinity. This means that optically induced current leakage is further suppressed. At the same time as this, the amorphous silicon layers in the driver circuit section are turned to polysilicon layers with high mobility.

According to a fourth aspect of the invention, another active-matrix addressing LCD device is provided, which comprises:
(a) the TFT array substrate according to the third aspect;
(b) an opposite substrate located to be opposite to the TFT array substrate; and
(c) a liquid-crystal layer formed between the TFT array substrate and the opposite substrate.

With the active-matrix addressing LCD device according to the fourth aspect of the invention, the same advantages as those shown in the TFT array substrate according to the third aspect of the invention are obtainable because of the same reason as above.

BRIEF DESCRIPTION OF THE DRAWINGS

In order that the present invention may be readily carried into effect, it will now be described with reference to the accompanying drawings.

FIGS. 7A to 11A are partial, cross-sectional views along the line VA—VA in FIG. 4, respectively, which show the process steps of fabricating the substrate of FIG. 4

FIGS. 7B to 11B are partial, cross-sectional views along the line VB—VB in FIG. 4, respectively, which show the process steps of fabricating the substrate of FIG. 4.

DETAILED DESCRIPTION OF THE PREFERRED EMBODIMETNS

Figure 1:
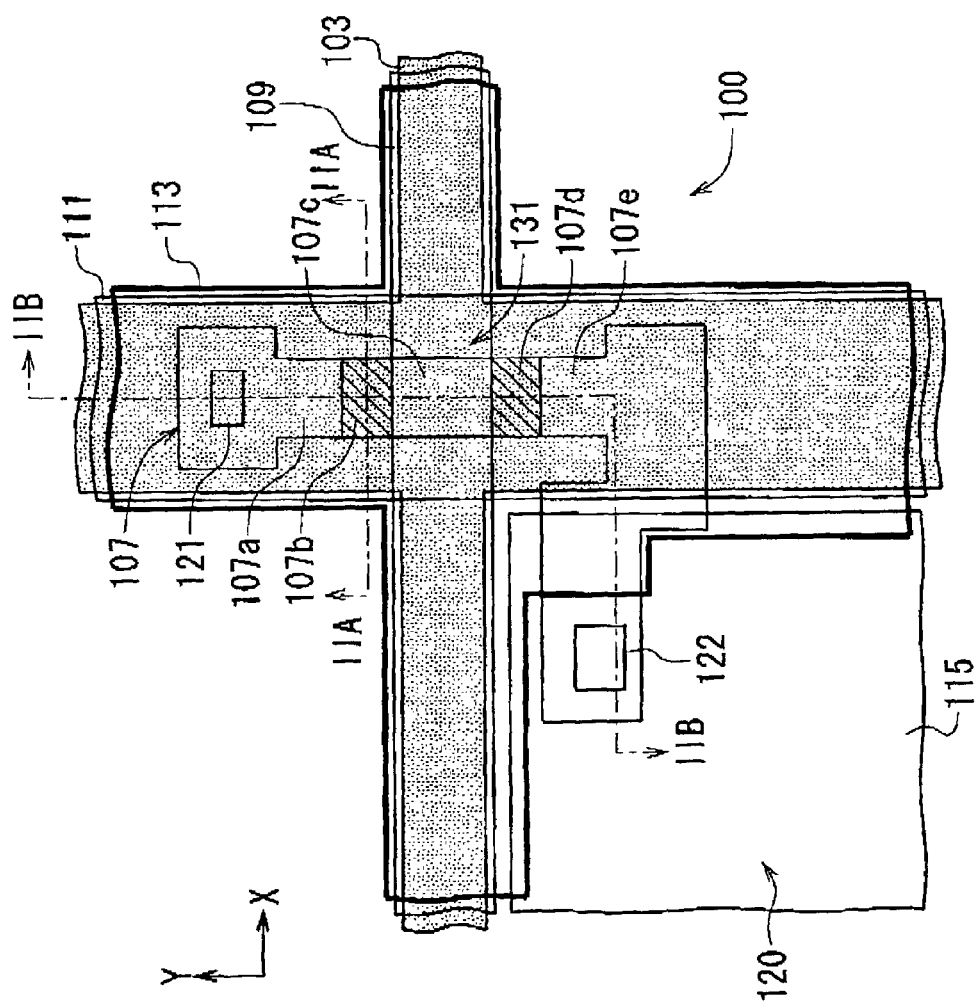
FIG. 1 is a partial plan view showing the layout of a prior-art TFT array substrate.

Preferred embodiments of the present invention will be described in detail below while referring to the drawings attached.

First Embodiment

Figure 4:
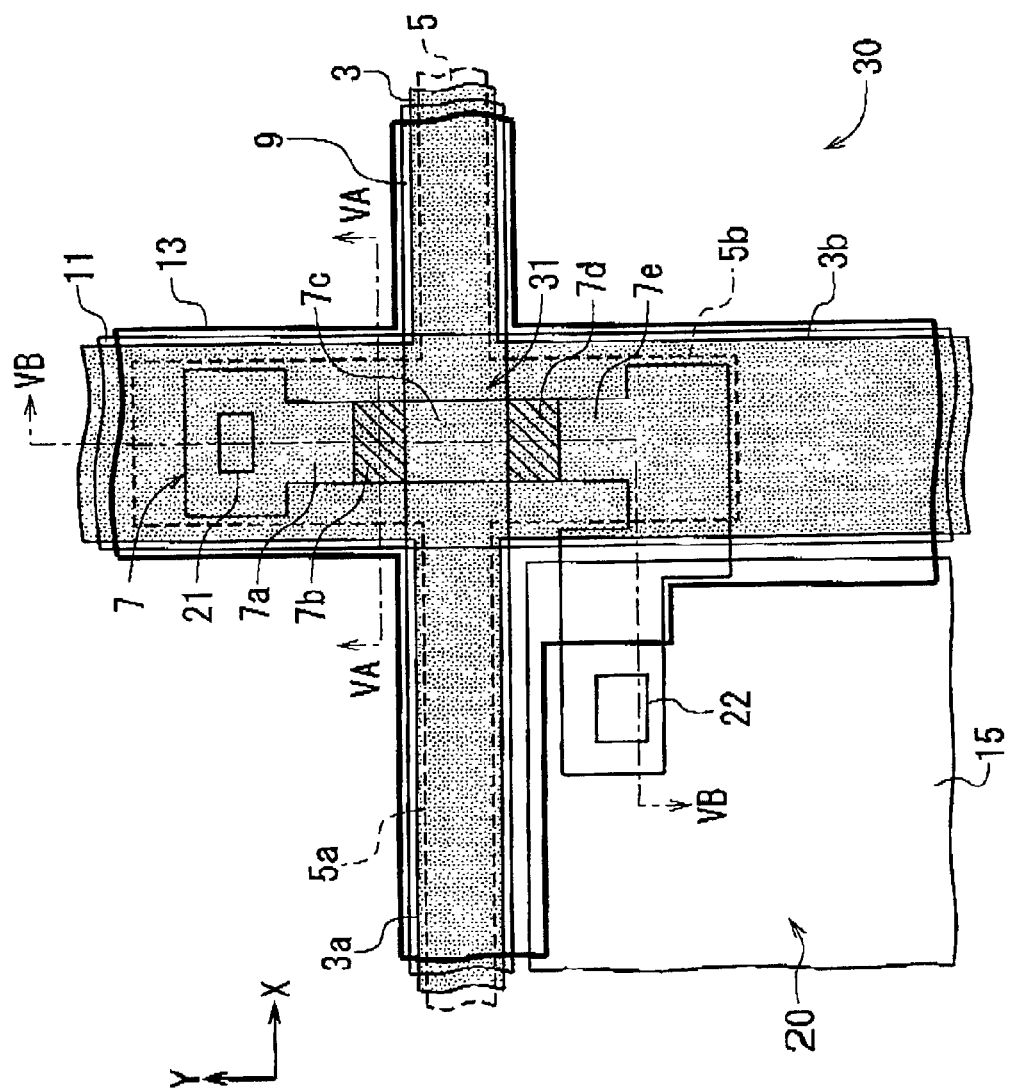
FIG. 4 is a partial plan view showing the layout of a TFT array substrate according to a first embodiment of the invention.
Figure 5A:
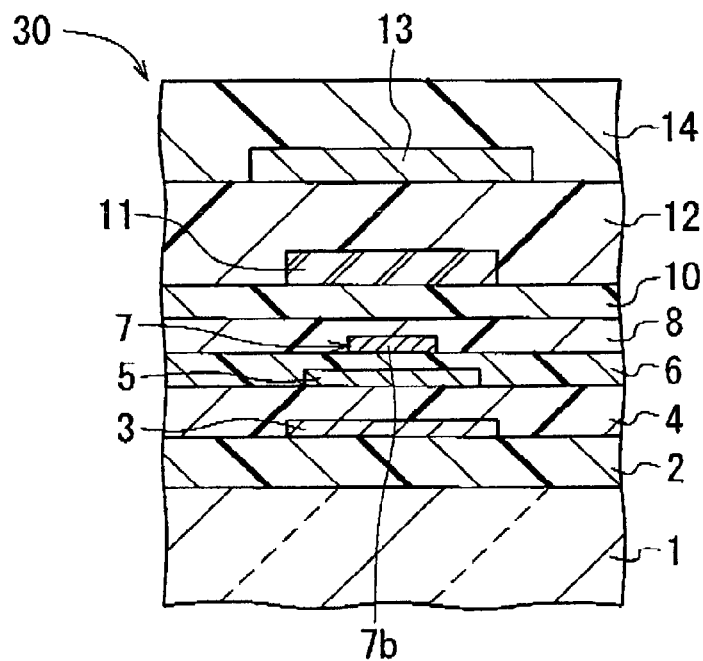
FIG. 5A is a partial, cross-sectional view along the line VA—VA in FIG. 4, which shows the structure of the substrate of FIG. 4.
Figure 5B:
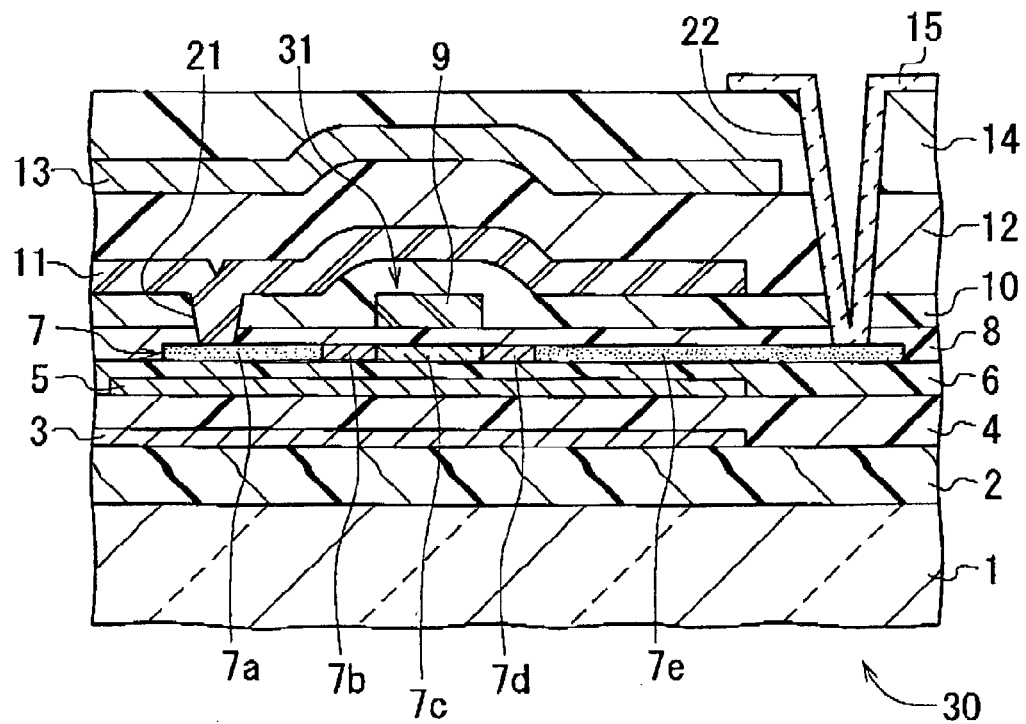
FIG. 5B is a partial, cross-sectional view along the line VB—VB in FIG. 4, which shows the structure of the substrate of FIG. 4.

FIG. 4 and FIGS. 5A and 5B show the schematic configuration of a TFT array substrate 30 according to a first embodiment of the invention, in which only one pixel is illustrated for simplification. This is applicable to any other embodiments explained later.

The TFT array substrate 30 comprises a transparent plate 1, on which TFTs 31 are arranged in a matrix array. The plate 1 is made of transparent and dielectric material such as glass.

A $SiO_2$ layer 2 is formed on the plate 1 to cover its whole surface. This layer 2 is to prevent heavy metals contained in the plate 1 from diffusing into the inside of the substrate 30.

A patterned first light-shielding layer 3 is formed on the $SiO_2$ layer 2. The plan shape of the layer 3 is like a lattice, which is formed by lateral strips 3a extending along the rows (the X direction in FIG. 4) of the matrix of the TFTs 31 and vertical strips 3b extending along the columns (the Y direction in FIG. 4) thereof and intersecting with the lateral ones. The layer 3 is made of a material having a sufficiently low optical transmittance (e.g., $WSi_2$). The thickness of the layer 3 is set to be large enough for blocking light entering directly from the back side of the substrate 30, i.e., from the side of the plate 1. The whole layer 3 is covered with an overlying $SiO_2$ layer 4.

On the $SiO_2$ layer 4, a patterned second light-shielding layer 5 is formed. The layer 5 is made of amorphous silicon having a light-absorbing property, The layer 5 comprises lateral strip-shaped parts 5a extending along the rows (the X direction in FIG. 4) of the matrix of the TFTs 31 and vertical rectangular parts 5b extending along the columns (the Y direction in FIG. 4) thereof and intersecting with the lateral parts Sa. The strip-shaped parts 5a are arranged vertically (in the Y direction) at equal intervals, which are parallel to each other. The rectangular parts 5b are arranged horizontally (in the X direction) at equal intervals, which are parallel to each other. The layer 5 is patterned to entirely overlap with the underlying first light shielding layer 3. The Layer 5 is covered with a $SiO_2$ layer 6 formed on the $SiO_2$ layer 4.

On the $SiO_2$ layer 6, polysilicon layers 7 are formed. Each of the layers 7 is patterned to have a plan shape of approximately L character. Each of the layers 7 is located at a position right below the intersection of a gate line 9 and a data line 11, which are explained later. The layer 7 serves as the active layer of each TFT 31.

Each of the polysilicon active layers 7 comprises an undoped channel region 7c, two lightly-doped LDD regions 7b and 7d, a heavily-doped source region 7a, and a heavily-doped drain region 7e. The source and drain regions 7a and 7e are located at each side of the channel region 7c. The LDD region 7b is located between the source region 7a and the channel region 7c. The LDD region 7d is located between the channel region 7c and the drain region 7e.

The source region 7a, the LDD region 7b, the channel region 7c, the LDD region 7d, and the drain region 7e are arranged along the Y direction in such a way as to overlap with the first and second light-shielding layers 3 and 5. Part of the drain region 7e is extended in the X direction.

A gate dielectric layer 8 is formed on the $SiO_2$ layer 6 to cover the underlying active layers 7.

Gate lines 9, which are made of impurity-doped polysilicon or silicide, are formed on the gate dielectric layer 8. These lines 9 are parallel to each other and extend in the X direction. Each of the lines 9 is located to overlap with the channel regions 7c of the TFTs 31 that belong to the same row of the matrix. The parts of the line 9 placed right over the regions 7c serve as gate electrodes of the corresponding TFTs 31. The lines 9 are entirely covered with a first interlayer dielectric layer 10 formed on the layer 8.

Data lines 11, which are made of Al, are formed on the first interlayer dielectric layer 10. These lines 11 are parallel to each other and extend in the Y direction. Each of the lines 11 is located to overlap with the active layers 7 of the TFTs 31 that belong to the same column of the matrix. The line 11 covers entirely the source regions 7a, the channel regions 7c, and the LDD regions 7b and 7d of the corresponding TFTs 31. The line 11 covers parts of the drain regions 7e of the corresponding TFTs 31. The line 11 is mechanically contacted with and electrically connected to the source regions 7a of the TFTs 31 that belong to the same row of the matrix by way of contact holes 21 that penetrate the first interlayer dielectric layer 10 and the gate dielectric layer 8. The lines 11 are entirely covered with a second interlayer dielectric layer 12.

A patterned black matrix layer 13, which is made of Cr, is formed on the second interlayer dielectric layer 12. The plan shape of the layer 13 is like a lattice, which is formed by lateral strips extending along the rows (the X direction in FIG. 4) of the matrix and vertical strips extending along the columns (the Y direction in FIG. 4) thereof and intersecting with the lateral ones. The layer 13 is patterned to overlap with the gate lines 9 and the data lines 11 and to cover the TFTs 31. The layer 13 serves as a third light-shielding layer. The layer 13 is entirely covered with a third interlayer dielectric layer 14 formed on the layer 12.

Pixel electrodes 15, which have an approximately rectangular plan shape, are formed on the third interlayer dielectric layer 14. The electrodes 15 are located in corresponding pixel areas 20 defined by the gate lines 9 and the data lines 11. The electrodes 15 are mechanically contacted with and electrically connected to the drain regions 7e of the corresponding TFTs 31 by way of contact holes 22 that penetrate the third interlayer dielectric layer 14, the second interlayer dielectric layer 12, the first interlayer dielectric layer 10, and the gate dielectric layer 8.

Figure 20:
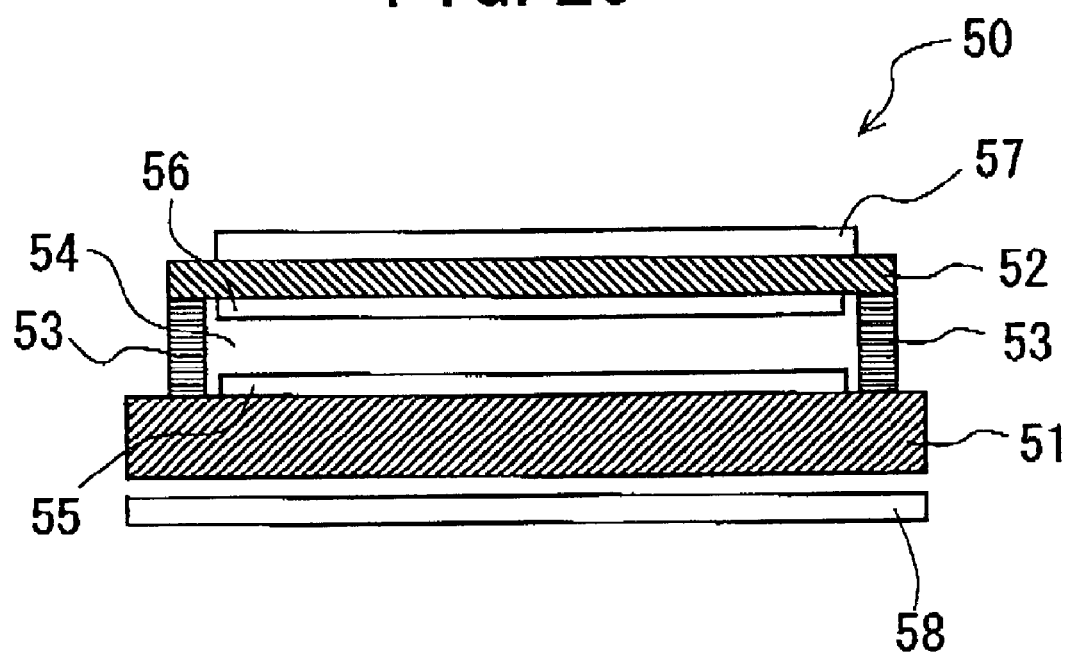
FIG. 20 is a schematic cross-sectional view showing the structure of an active-matrix addressing LCD device using the TFT array substrate according to the invention.

FIG. 20 shows the structure of an active-matrix addressing LCD device 50, which includes the TFT array substrate 51 having the structure according to the first embodiment.

An opposite substrate 52 is coupled with the substrate 51 to form a liquid crystal layer 54 therebetween with a sealing member 53. In the layer 54, an alignment layer 55 is formed on the substrate 51 and an alignment layer 56 is formed on the substrate 52. A polarizer plate 57 is provided on the substrate 52. A back light 58 is provided near the substrate 51.

Figure 6:
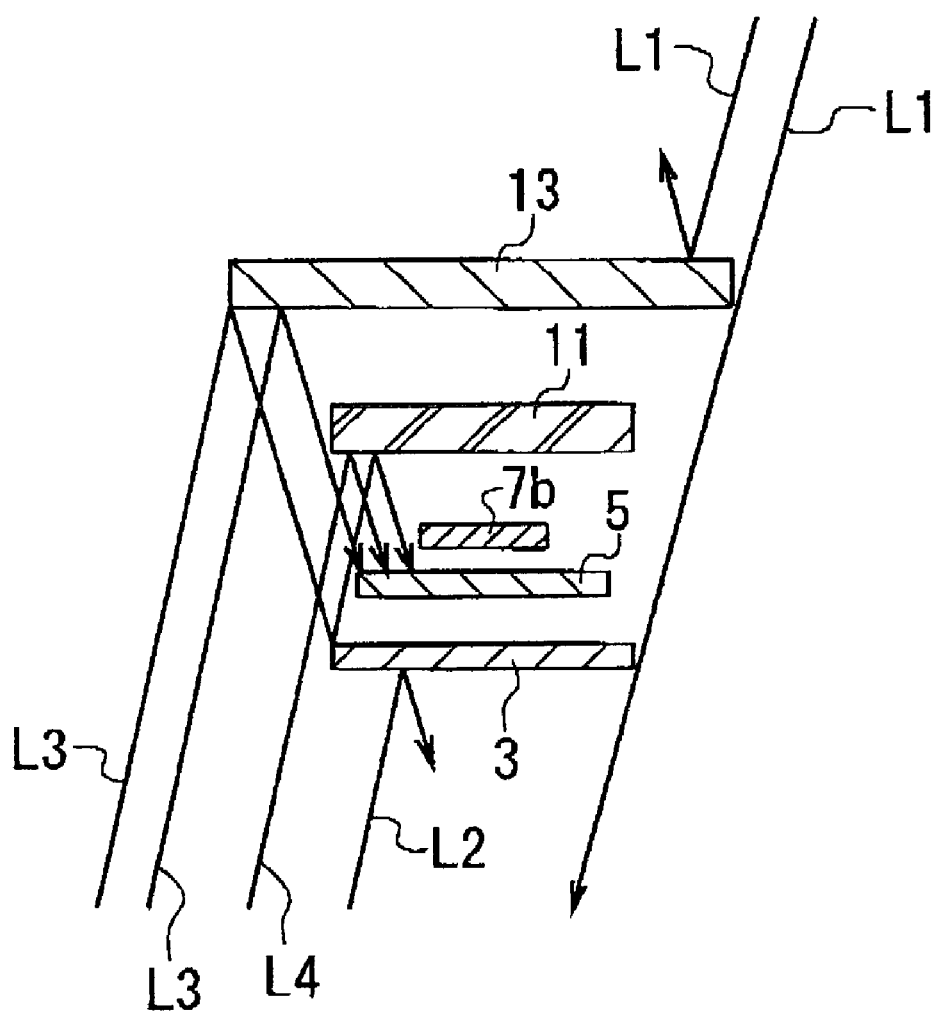
FIG. 6 is a schematic cross-sectional view showing the effect to block the light entering the inside of the substrate of FIG. 4, which is along the line VA—VA in FIG. 4.

With the active-matrix addressing LCD device 50, as shown in FIG. 6, the light L1 entering the device 50 from the side of the opposite substrate 52 is blocked by the black matrix layer (i.e., the third light-shielding layer) 13. Alternately, the light L1 penetrates the substrate 30 without reflection by the first light-shielding layer 3. This is because the widths of the layers 13 and 3 and the interval between the layers 13 and 3 are well adjusted for this purpose.

On the other hand, the light L2 entering the device 50 from the side of the TFT array substrate 30 (51) is blocked by the first light-shielding layer 3. The light L3 entering the device 50 from the side of the substrate 30 toward the black matrix layer 13 is reflected by the layer 13 to go to the first light-shielding layer 3. Then, the light L3 reaches the second light-shielding layer 5 located between the layer 3 and the TFTs 31. Alternately, the light L3 is reflected by the layer 13 and 3 and then, the light L3 reaches the second light-shielding layer 5. Moreover, the light L4 entering the device 50 from the side of the substrate 30 toward the data line 11 is reflected by the line 11 and finally, it reaches the layer 5.

As explained above, the second light-shielding layer 5 is made of amorphous Si having a light-absorbing property. Thus, the light L1 to L4 are absorbed by the layer 5.

In this way, even if light traveling from the side of the plate 1 is directly inputted into the inner space between the first light-shielding layer 3 and the data lines 11 or indirectly inputted into the same by way of reflection by the third patterned light-shielding layer (i.e., the black matrix layer) 13, the light will be absorbed by the second light-shielding layer 5. Thus, any light traveling toward the channel region 7c and the LDD regions 7b and 7d of each TFT 31 is blocked effectively and certainly.

In addition, the channel region 7c of each TFT 31 is covered with the corresponding one of the gate lines 9 and therefore, the effect to block the light traveling toward the region 7c is enhanced.

Generally, the silicon layer has a spectral light-absorption characteristic that the light-absorption rate is relatively high for the wavelength range of green and blue and relatively low for the wavelength range of red. This is applicable to the amorphous Si for forming the second light-shielding layer 5 and polysilicon layer for forming the active layer 7. As known well, the current leakage of the TFTs 31 is induced by absorption of light in the polysilicon active layer 7 and therefore, the magnitude or quantity of the current leakage varies dependent on the wavelength of light to be irradiated. As a result, by making the second light-shielding layer 5 of amorphous silicon whose spectral absorption characteristic is similar in tendency to that of polysilicon, the current leakage can be efficiently suppressed or decreased.

When high-luminance light is inputted into the TFT array substrate 30, the temperature of the vicinity of the TFT 31 will rises due to the heat generated by absorption of light in the second light-shielding layer 5. As described above, the absorption rate of the layer 5 is relatively lower for the wavelength range of red. Therefore, there is an additional advantage that the temperature rise occurring in the vicinity of the TFT 31 is suppressed more.

Instead of amorphous Si, microcrystalline silicon or polysilicon, or silicide including Si may be used for the same purpose. Substantially the same advantages as those of amorphous Si are obtainable.

Next, a method of fabricating the TFT array substrate 30 according to the first embodiment of FIGS. 4 and 5A to 5B is explained below with reference to FIGS. 7A to 11A and 7B to 11B.

Figure 7A:
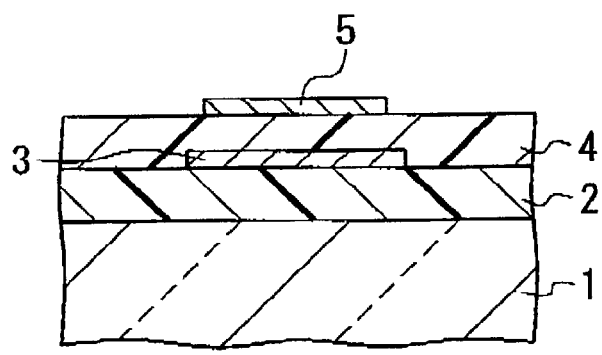
Figure 7B:
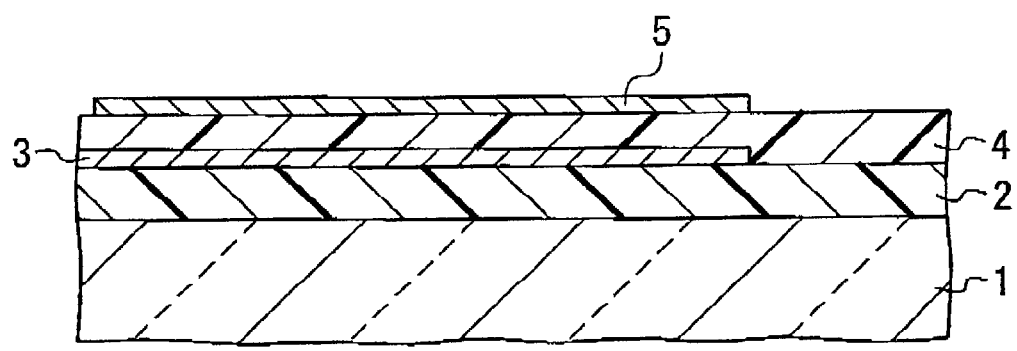

First, as shown in FIGS. 7A and 7B, by a popular CVD (Chemical Vapor Deposition) process, the $SiO_2$ layer 2 is formed on the transparent plate 1. Then, a tungsten silicide ($WSi_2$) layer (not shown) is formed on the $SiO_2$ layer 2. The $WSi_2$ layer thus formed is patterned to form the first light-shielding layer 3 with popular photolithography and etching techniques. Thereafter, the $SiO_2$ layer 4 is formed on the $SiO_2$ layer 2 by a CVD process to cover the whole layer 3.

Next, an amorphous Si layer (not shown) is deposited on the $SiO_2$ layer 4 by a Low-Pressure CVD (LPCVD) or plasma-Enhanced CVD (PECVD) process. The $SiO_2$ layer thus formed is patterned with popular photolithography and etching techniques, thereby forming the second light-shielding layer 5 on the layer 4.

Figure 8A:
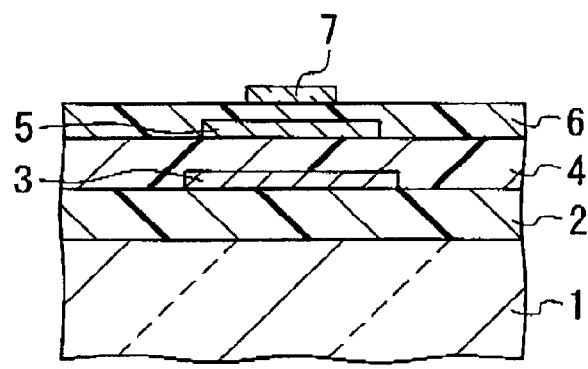
Figure 8B:
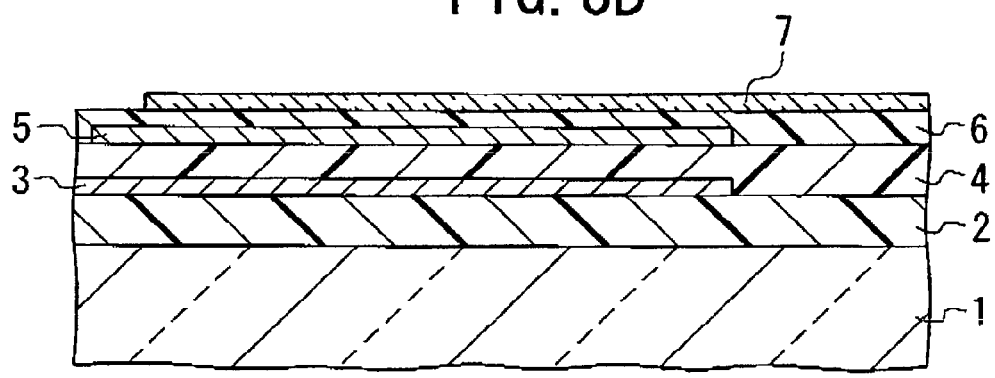

Thereafter, as shown in FIGS. 8A and 8B, the $SiO_2$ layer 6 is deposited on the $SiO_2$ layer 4 by a CVD process to cover the second light-shielding layer 5. An amorphous Si layer (not shown) is deposited on the layer 6 by a LPCVD or PECVD process. The amorphous Si layer thus deposited is crystallized by a laser annealing method. The Si layer thus crystallized is patterned with popular photolithography and etching techniques, thereby forming the polysilicon active layers 7 of the TFTs 31 on the layer 6.

Figure 9A:
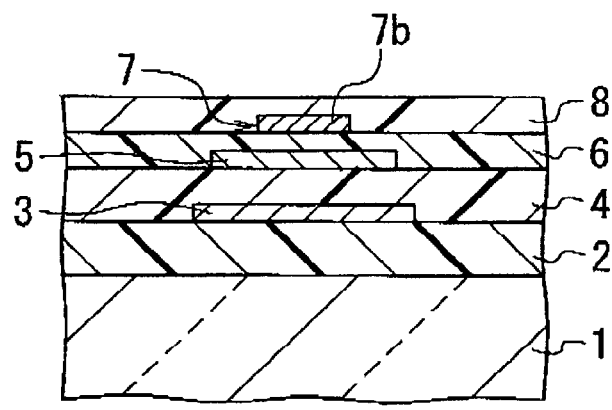
Figure 9B:
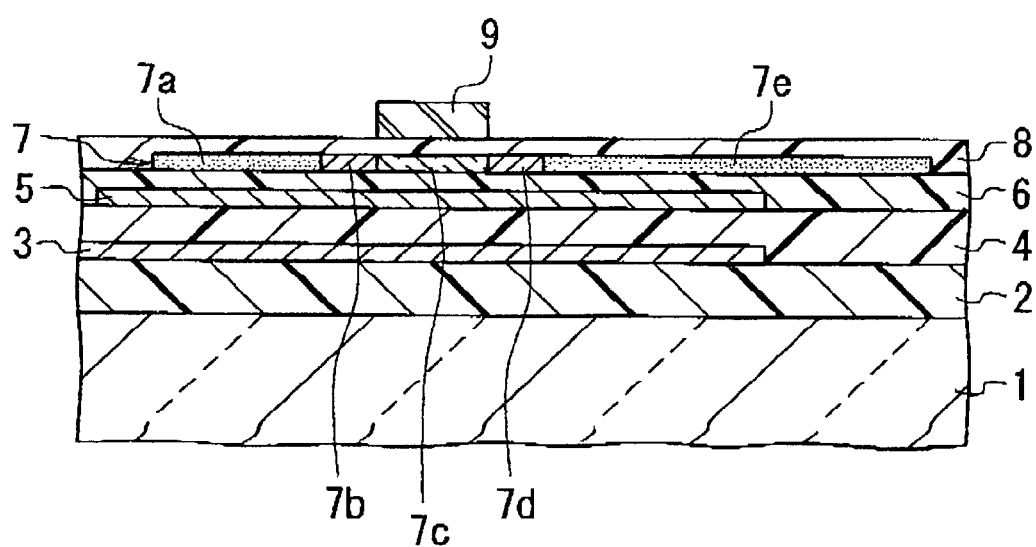

Subsequently, as shown in FIGS. 9A and 9B, the $SiO_2$ layer (i.e., the gate dielectric layer) 8 is deposited on the $SiO_2$ layer 6 by a CVD process to cover the polysilicon active layers 7. An impurity-doped polysilicon layer (not shown) and a silicide layer (not shown) are successively deposited on the gate dielectric layer 8 and then, they are patterned with popular photolithography and etching techniques, thereby forming the gate lines 9.

Using the gate lines 9 thus formed as a mask, an impurity is selectively doped into the polysilicon active layers 7 at a low doping concentration. Then, using a patterned photoresist mask (not shown), an impurity is selectively doped into the polysilicon active layers 7 at a high doping concentration. Thus, the source regions 7a, the LDD regions 7b and 7d, the channel regions 7c, and the drain regions 7e are formed in the layers 7.

Figure 10A:
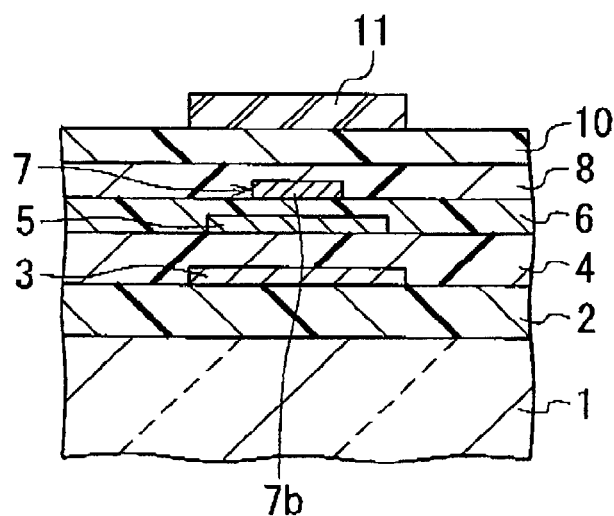
Figure 10B:
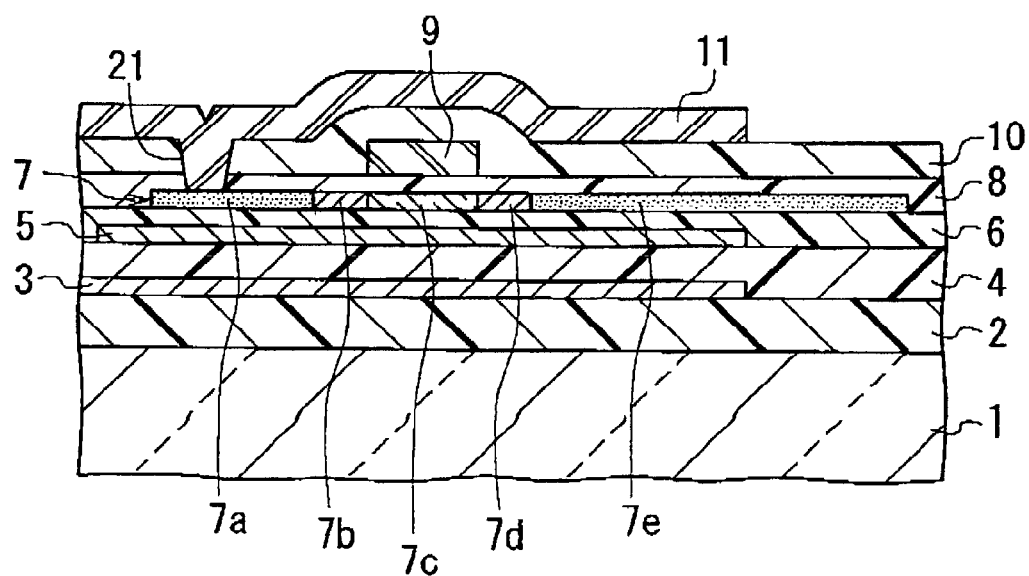

Following this, as shown in FIGS. 10A and 10B, a $SiO_2$ layer serving as the first interlayer dielectric layer 10 is deposited on the gate dielectric layer 8 by a CVD process to cover the gate lines 9. Then, with popular photolithography and etching techniques, the first interlayer dielectric layer 10 and the gate dielectric layer 8 are selectively removed, thereby forming the contact holes 21 that expose the source regions 7a.

An Al layer (not shown) is deposited by a sputtering process and patterned with popular photolithography and etching techniques, thereby forming the data lines 11. The lines 11 are contacted with the source regions 7a by way of the holes 21. Thus, the lines 11 are electrically connected to the regions 7a.

Figure 11A:
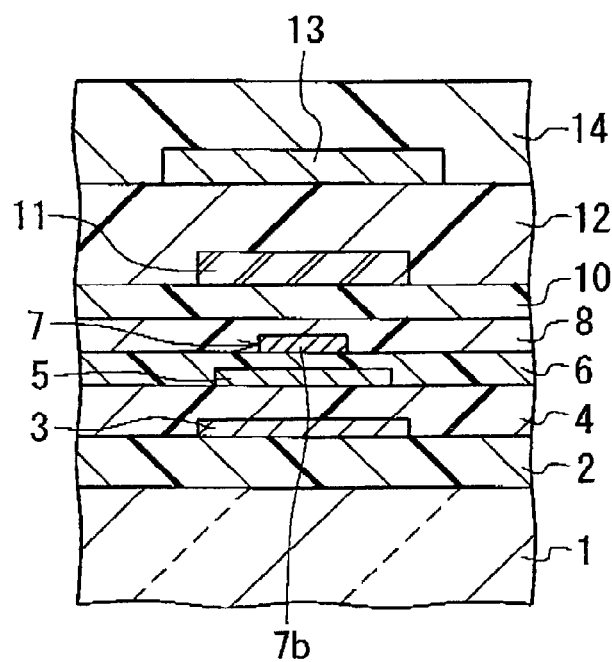
Figure 11B:
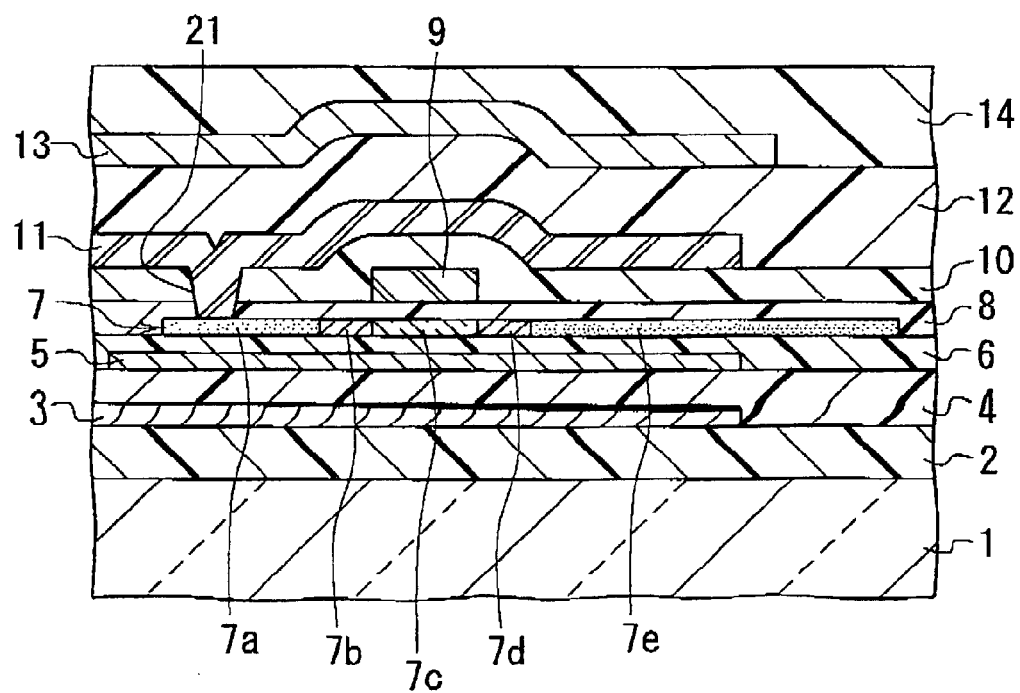

As shown in FIGS. 11A and 11B, a $SiO_2$ layer serving as the second interlayer dielectric layer 12 is deposited on the first interlayer dielectric layer 10 by a CVD process to cover the data lines 11. Then, a Cr layer (not shown) is deposited on the layer 12 by a sputtering process and then, it is patterned with popular photolithography and etching techniques, thereby forming the black matrix layer 13 serving as the third light-shielding layer.

Thereafter, a $SiO_2$ layer serving as the third interlayer dielectric layer 14 is deposited on the second interlayer dielectric layer 12 by a CVD process to cover the black matrix layer 14.

With popular photolithography and etching techniques, the third interlayer dielectric layer 14, the second interlayer dielectric layer 12, the first interlayer dielectric layer 10, and the gate dielectric layer 8 are selectively removed, thereby forming the contact holes 22 that expose the drain regions 7e. Then, an ITO (Indium Tin Oxide) layer (not shown) is deposited on the layer 14 and then, it is patterned with popular photolithography and etching techniques, thereby forming the pixel electrodes 15. The electrodes 15 are contacted with the drain regions 7e by way of the holes 22. Thus, the electrodes 15 are electrically connected to the regions 7e.

Figure 2A:
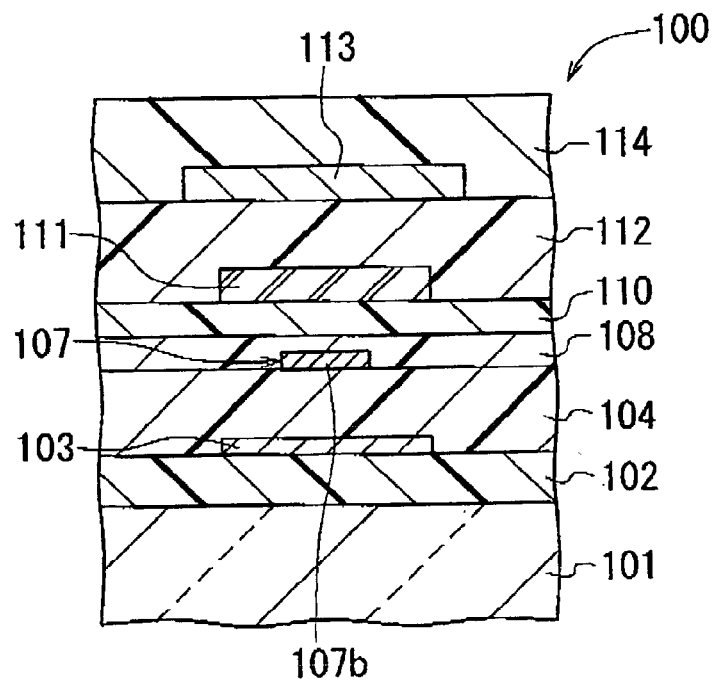
FIG. 2A is a partial, cross-sectional view along the line IIA—IIA in FIG. 1, which shows the structure of the prior-art substrate of FIG. 1.
Figure 2B:
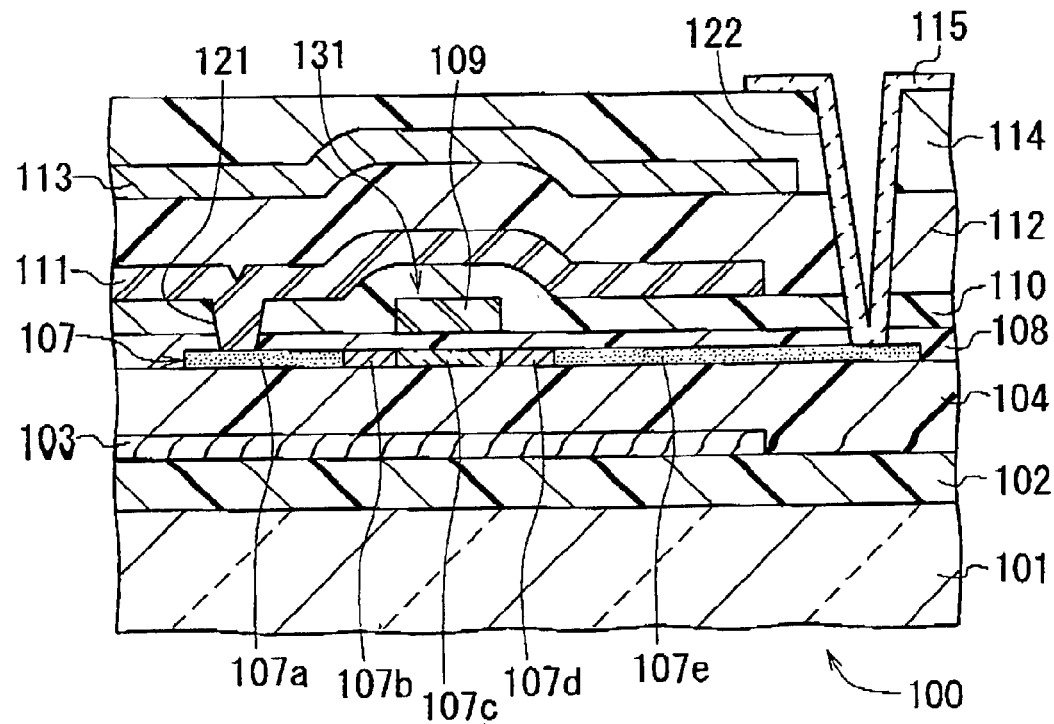
FIG. 2B is a partial, cross-sectional view along the line IIB—IIB in FIG. 1, which shows the structure of the prior-art substrate of FIG. 1.
Figure 3:
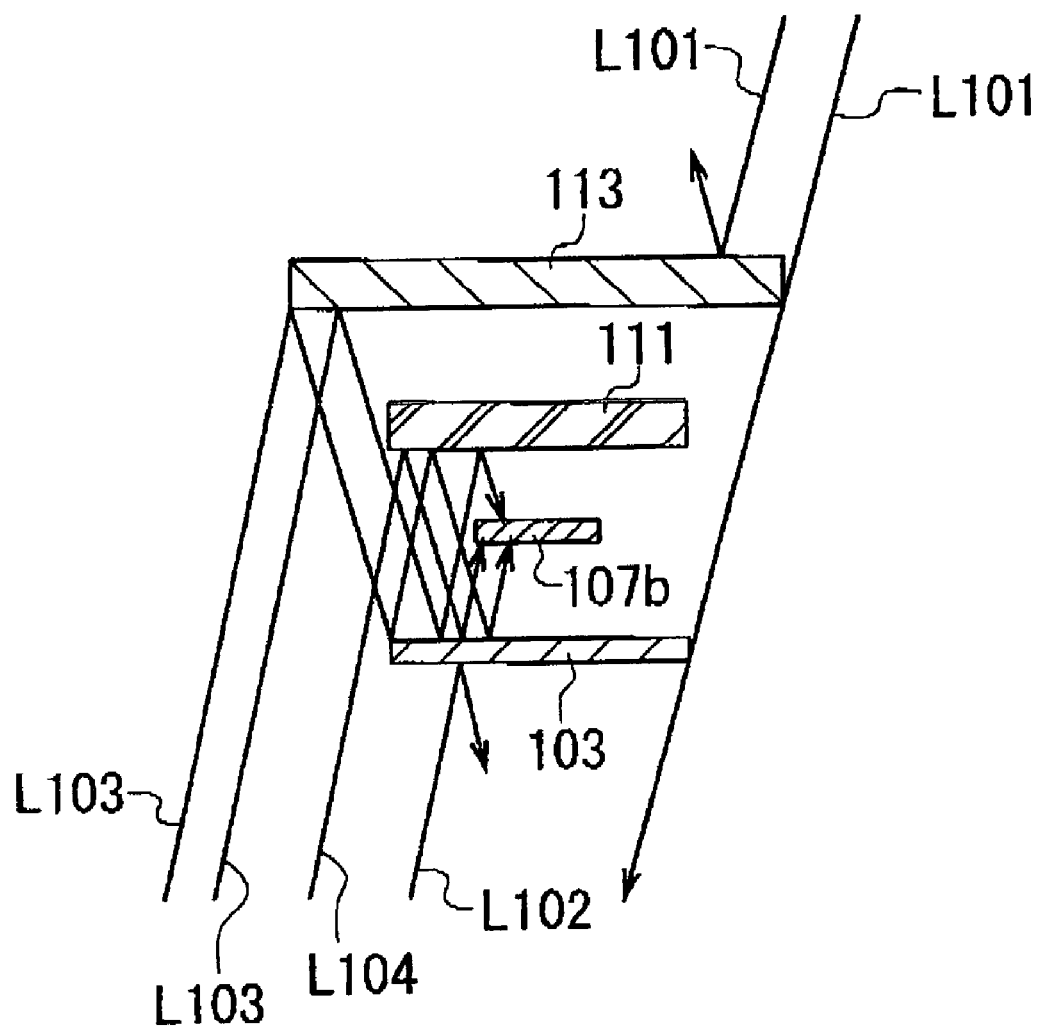
FIG. 3 is a schematic cross-sectional view showing the effect to block the light entering the inside of the prior-art substrate of FIG. 1, which is along the line IIA—IIA in FIG. 1.

Through the above-described process steps, the TFT array substrate 30 shown in FIGS. 1 and 2A to 2B is formed. As seen from this easily, the fabrication process steps of the substrate 30 are simple and include no complicated steps. As a result, the substrate 30 can be fabricated easily.

With the TFT array substrate 30 according to the first embodiment of the invention, the patterned first light-shielding layer 3 is formed between the plate 1 and the TFTs 31 in such a way as to overlap with the active layers 7 of the TFTs 31. The patterned third light-shielding (i.e., the black matrix) layer 13 is formed to cover the TFTs 31 on the opposite side to the plate 1 with respect to the TFTs 31. The third light-shielding layer 13 has the first parts extending along the rows of the matrix and the second parts extending along the columns thereof. Moreover, the patterned second light-shielding layer 5 is formed between the first light-shielding layer 3 and the TFTs 31. The layer 5 has a light-absorbing property.

Therefore, even if light entering the inside of the TFT array substrate 30 from the side of the plate 1 is reflected by the third patterned light-shielding layer 13 and/or the data lines 11 and then, it is reflected by the first patterned light-shielding layer 3, the whole reflected light will reach the patterned second light-shielding layer 5. Since the second light-shielding layer 5 has a light-absorbing property, the reflected light will be absorbed by the layer 5. Thus, any light traveling toward the active layers 7 of the TFTs 31 in the substrate 30 is effectively blocked. This means that the active layers 7 are not exposed to the light. As a result, the optically induced current leakage in the TFTs 31 is suppressed, thereby improving the contrast and uniformity of image quality.

Moreover, the complicated fabrication process steps as disclosed in the Japanese Non-Examined Patent Publication Nos. 2000-180899 and 2000-356787 are unnecessary Thus, the substrate 30 can be fabricated easily without complicated process steps.

The dielectric layer thickness between the first light-shielding layer 3 and the second light-shielding layer 5 and the dielectric layer thickness between the second light-shielding layer 5 and the active layers 7 are important parameters for the present invention. In particular, the dielectric layer thickness between the second light-shielding layer 5 and the active layers 7 is more important. The smaller the dielectric layer thickness between the second light-shielding layer 5 and the active layers 7, the higher the light-shielding effect. According to the inventors' test, it was found that the light-shielding effect was striking when the dielectric layer thickness between the layers 5 and 7 was set at 500 nm or less.

Moreover, the inventors found that if the dielectric layer thickness between the second light-shielding layer 5 and the active layers 7 was small, the transistor characteristics of the TFTs 31 were affected, and the laser annealing process to crystallize amorphous silicon layers designed for the active layers 7 was affected as well. Therefore, to get the light-shielding effect of the invention, they found that the dielectric layer thickness between the layers 5 and 7 was preferably set in the range from 500 nm to 100 nm, and more preferably in the range from 300 nm to 150 nm. This is applicable to the other embodiments of the invention explained below.

Second Embodiment

Figure 12:
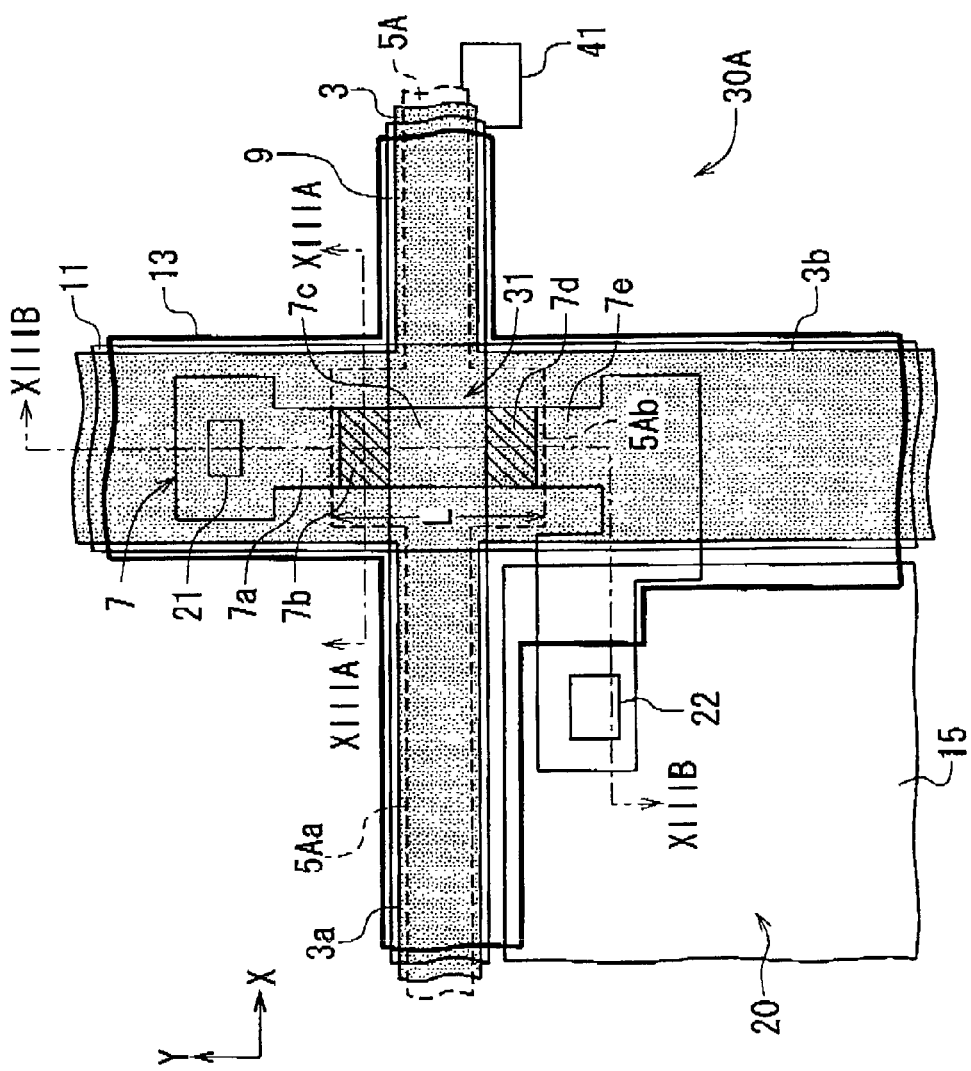
FIG. 12 is a partial plan view showing the layout of a TFT array substrate according to a second embodiment of the invention.
Figure 13A:
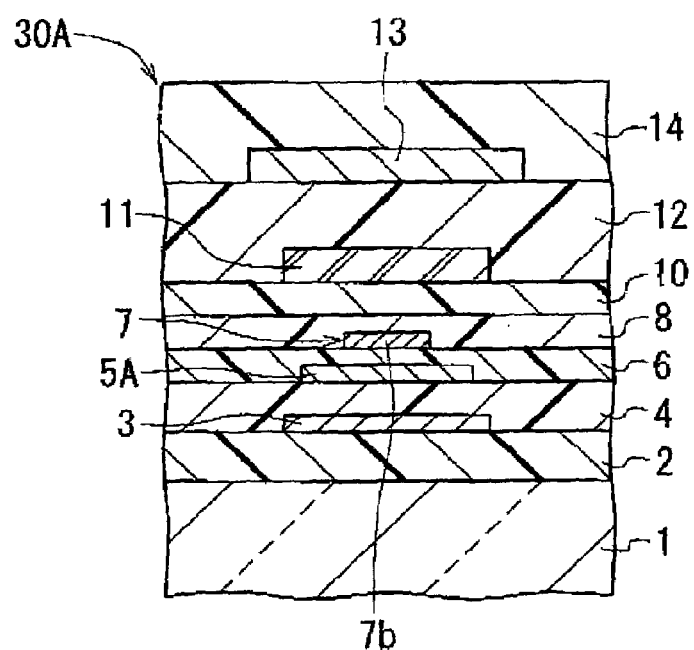
FIG. 13A is a partial, cross-sectional view along the line XIIIA—XIIIA in FIG. 12, which shows the structure of the substrate of FIG. 12.
Figure 13B:
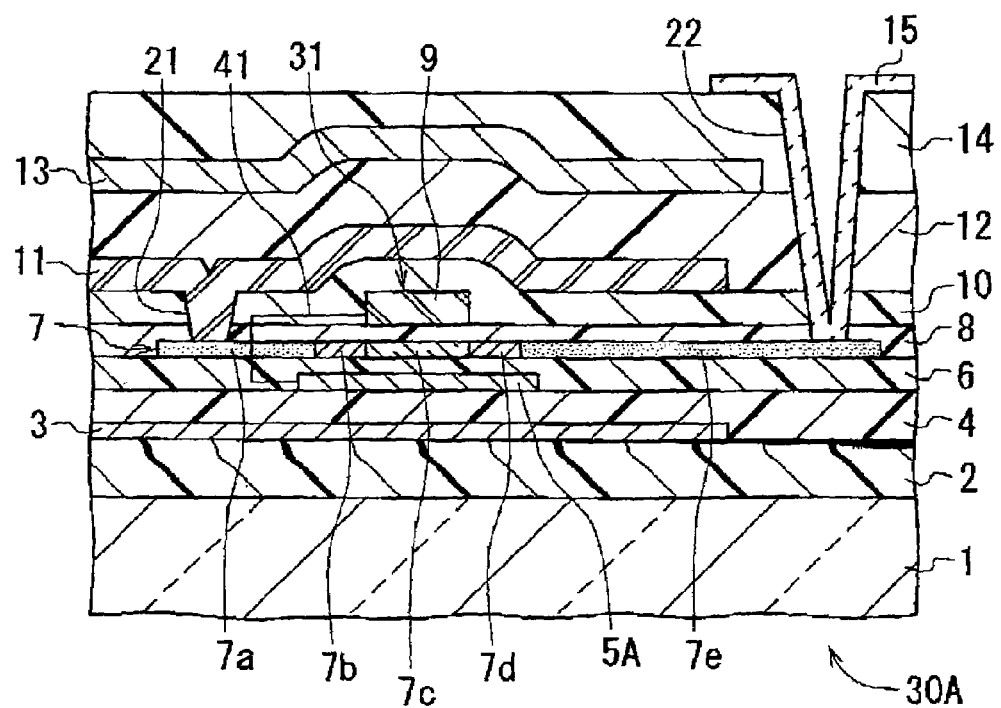
FIG. 13B is a partial, cross-sectional view along the line XIIIB—XIIIB in FIG. 12, which shows the structure of the substrate of FIG. 12.

FIGS. 12 and 13A to 13B show the structure of a TFT array substrate 30A according to a second embodiment of the invention, in which only one pixel is illustrated for simplification.

The substrate 30A of the second embodiment has the same configuration as the substrate 30 of the first embodiment, except that a second light-shielding layer 5A has conductivity and electrically connected to the corresponding gate lines 9. Therefore, the explanation about the same configuration is omitted here for the sake of simplification by attaching the same reference symbols as used in the first embodiment of FIGS. 4 and 5A to 5B to the same or corresponding elements in the second embodiment of FIGS. 12 and 13A and 13B.

In the substrate 30A, the second light-shielding layer 5A, which is made of an impurity-doped polysilicon, is formed on the $SiO_2$ layer 4. The layer 5A has strip-shaped first parts 5Aa extending along the rows of the matrix (i.e., in the X direction) and rectangular second parts 5Ab extending along the columns of the matrix (i.e., in the Y direction). The first parts 5Aa are parallel to each other. The layer 5A is formed in such a way as to overlap with the first light-shielding layer 3. The second parts 5Ab are overlapped with the respective polysilicon active layers 7.

The second light-shielding layer 5A is electrically connected to the corresponding gate lines 9 by way of internal wiring lines 41. Therefore, parts of the gate lines 9 serve as first gate electrodes of the TETs 31 and at the same time, the layer 5A serves as the common second gate electrode thereof. This means that the TFTs 31 serve as dual-gate Field-Effect Transistors (FETs).

In this way, with the substrate 30A of the second embodiment, the second light-shielding layer 5A is used as the common second gate electrode and therefore, the inter-electrode capacitance of the TFTs 31 increases. To suppress the increase of the inter-electrode capacitance, the length L of the second part 5Ab in the Y direction is decreased compared with the first embodiment.

Specifically, the second part 5Ab of the second light-shielding layer 5A is overlapped with the channel region 7c, and the LDD regions 7b and 7d of the TFT 31 while it is scarcely overlapped with the source and drain regions 7a and 7e. Due to this structure, the increase of the inter-electrode capacitance of the TFT 31 can be suppressed at a level where no problem occurs practically while keeping the effect to block the light traveling toward the channel and LDD regions 7c, 7b, and 7d.

The substrate 30A is fabricated in substantially the same method as used in the first embodiment.

With the TFT array substrate 30A according to the second embodiment, the same advantages as those in the first embodiment are obtainable. Specifically, any light traveling toward the active layers 7 of the TFTs 31 in the substrate 30A is effectively blocked. This means that the active layers 7 are not exposed to the light. As a result, the optically induced current leakage in the TFTs 31 is suppressed, thereby improving the contrast and uniformity of image quality. Moreover, the substrate 30A can be fabricated easily without complicated process steps.

The substrate 30A has an additional advantage that an improved on/off characteristic of the TFTs 31 is obtainable, because the TOTS 31 serve as dual-gate FETs.

Third Embodiment

Figure 14:
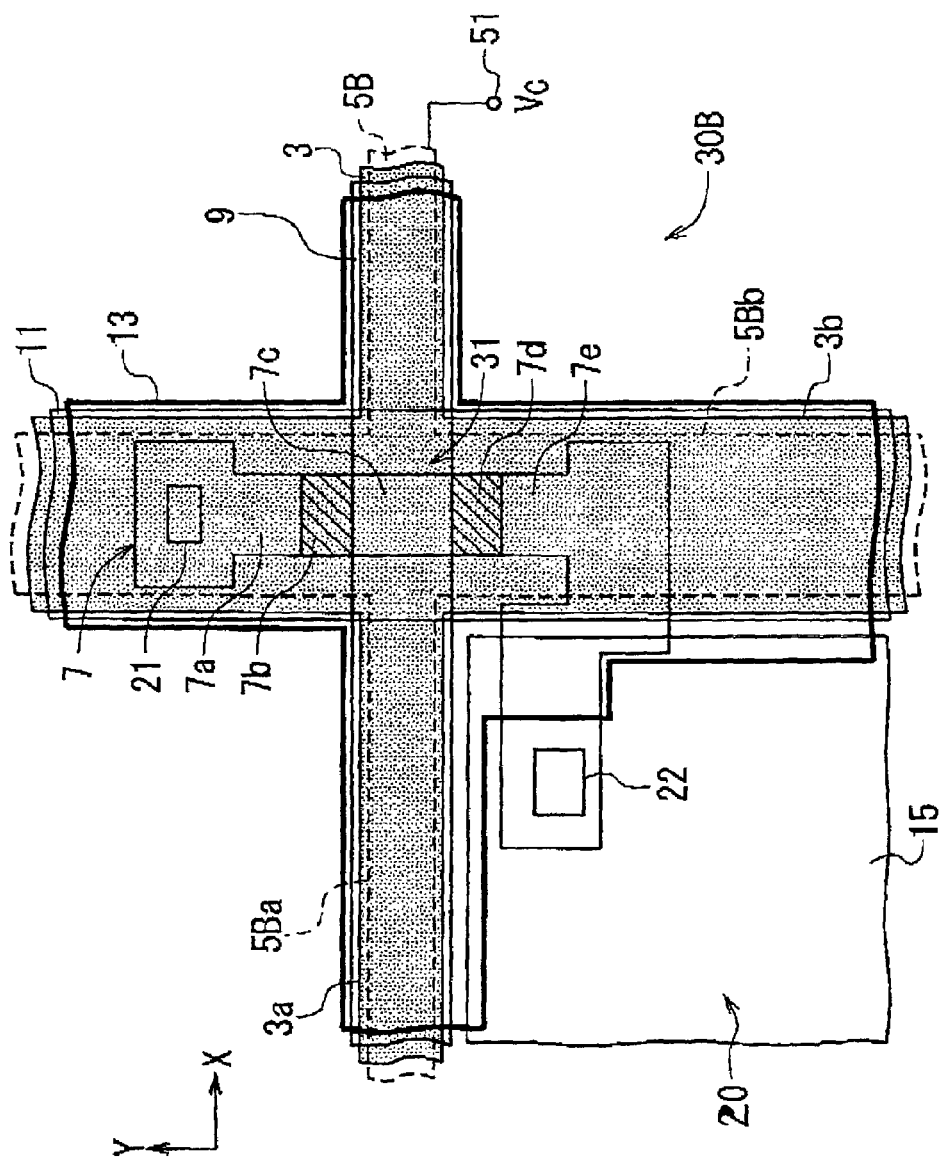
FIG. 14 is a partial plan view showing the layout of a TFT array substrate according to a third embodiment of the invention.

FIGS. 14 and 15A to 15B show the structure of a TFT array substrate 30B according to a third embodiment of the invention, in which only one pixel is illustrated for simplification.

The substrate 30B of the third embodiment has the same configuration as the substrate 30 of the first embodiment, except that a second light-shielding layer 5B has conductivity and is applied with a constant voltage $V_c$. Therefore, the explanation about the same configuration is omitted here for the sake of simplification by attaching the same reference symbols as used in the first embodiment of FIGS. 4 and 5A to 5B to the same or corresponding elements in the second embodiment of FIGS. 14 and 15A and 15B.

In the substrate 30B, the second light-shielding layer 5B, which is made of an impurity-doped polysilicon is formed on the $SiO_2$ layer 4. The layer 5B has strip-shaped first parts 5Ba extending along the rows of the matrix (i.e., in the X direction) and strip-shaped second parts 5Bb extending along the columns of the matrix (i.e., in the Y direction). The first parts 5Ba are parallel to each other and at the same time, the second parts 5Bb are parallel to each other. The first and second parts 5Ba and 5Bb are intersected with each other to form a lattice-shaped plan shape. The layer 5B is formed in such a way as to overlap with the first light-shielding layer 3. The second parts 5Bb are overlapped with the respective polysilicon active layers 7.

The second light-shielding layer 5B is electrically connected to an external terminal 51 through which a constant voltage $V_c$ is supplied to the layer 5B. Thus, the layer 5B is biased at the voltage $V_c$. By adjusting the value of the voltage $V_c$, the characteristic of the TFT 31 can be controlled as desired.

The substrate 30B is fabricated in substantially the same method as used in the first embodiment.

With the TFT array substrate 30B according to the third embodiment, the same advantages as those in the first embodiment are obtainable. Specifically, any light traveling toward the active layers 7 (especially, the channel region 7c and the LDD regions 7b and 7d) of the TFTs 31 in the substrate 30B is effectively blocked. This means that the active layers 7 are not exposed to the light. As a result, the optically induced current leakage in the TFTs 31 is suppressed, thereby improving the contrast and uniformity of image quality. Moreover, the substrate 30B can be fabricated easily without complicated process steps.

The substrate 30B has an additional advantage that the characteristic of the TFTs 31 is controllable by adjusting the value of the voltage VC applied to the second light-shielding layer 5B.

Fourth Embodiment

Figure 15:
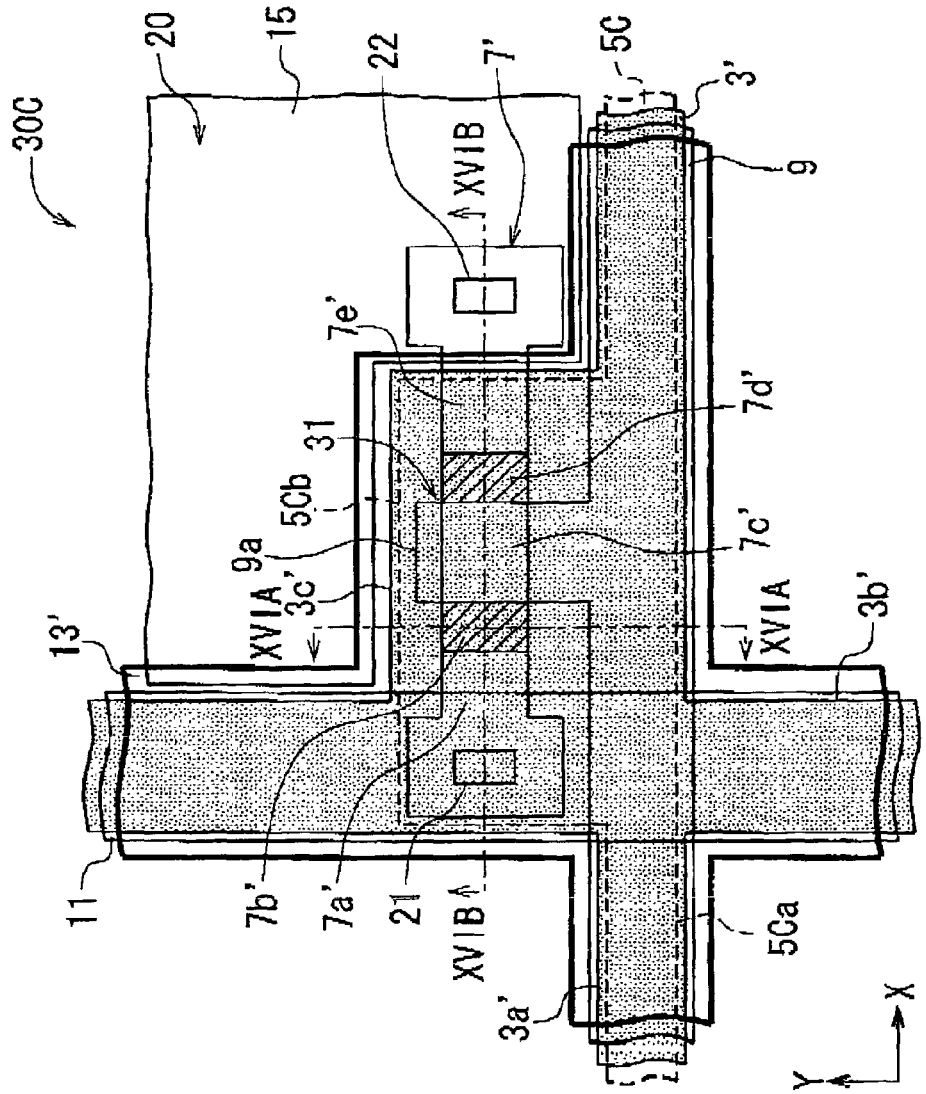
FIG. 15 is a partial plan view showing the layout of a TFT array substrate according to a fourth embodiment of the invention.
Figure 16A:
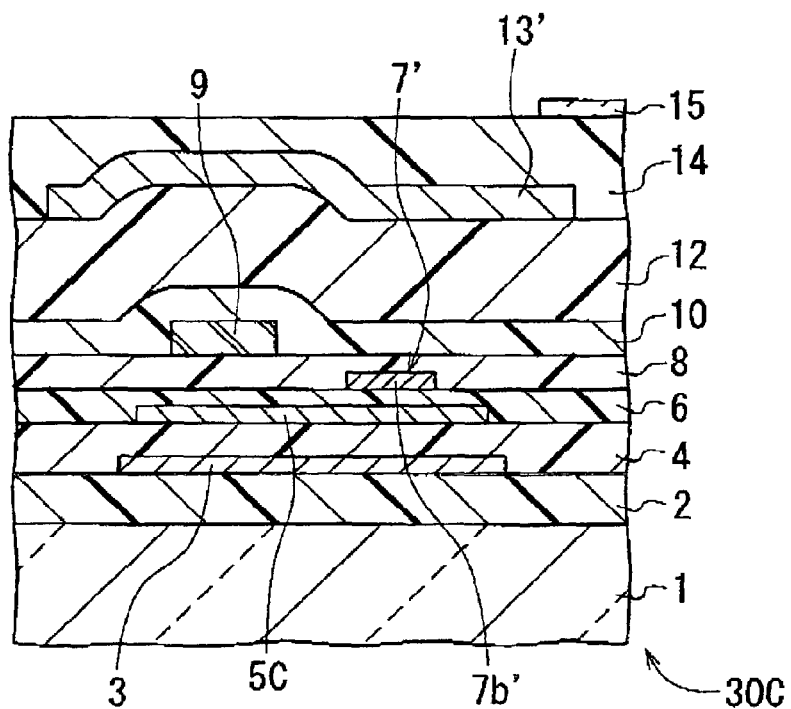
FIG. 16A is a partial, cross-sectional view along the line XVIA—XVIA in FIG. 15, which shows the structure of the substrate of FIG. 15.
Figure 16B:
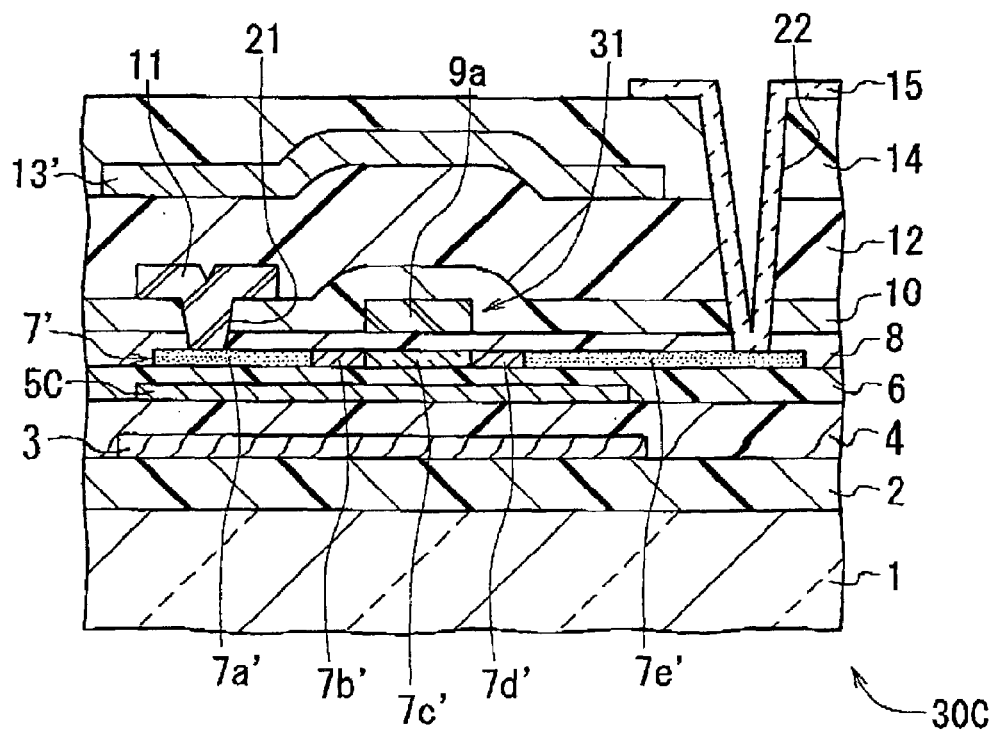
FIG. 16B is a partial, cross-sectional view along the line XVIB—XVIB in FIG. 15, which shows the structure of the substrate of FIG. 15.

FIGS. 15 and 16A to 16B show the structure of a TFT array substrate 30C according to a fourth embodiment of the invention, in which only one pixel is illustrated for simplification.

The substrate 30C of the fourth embodiment is obtained by applying the invention to the structure or form of the TFT array substrate where the TFTs 31 are not covered with the data lines Specifically, polysilicon active layers 7' of the TFTs 31 extend along the rows of the matrix. A patterned first light-shielding layer 3', a patterned second light-shielding layer 5C, and a patterned third light-shielding layer (i.e., a black matrix layer) 13' are formed in such a way as to overlap with the active layers 7'. The TFTs 31 have their respective gate electrodes 9a electrically connected to the gate lines 9.

In the substrate 30C, the first light-shielding layer 3', which is formed on the $SiO_2$ layer 2, has strip-shaped first parts 3a' extending along the rows of the matrix (i.e., in the X direction), strip-shaped second parts 3b' extending along the columns of the matrix (i.e., in the Y direction), and rectangular third parts 3c' laterally protruding to cover the corresponding pixel areas 20. The first and second parts 3a' and 3b' are intersected with each other to thereby constitute a lattice-like plan shape. The third parts 3c' are located at the respective intersections of the parts 3a' ad 3b'. The layer 3' is made of a material having a sufficiently low optical transmittance (e.g., $WSi_2$). The thickness of the layer 3' is set to be large enough for blocking light entering directly from the back side of the substrate 30C, i.e., from the side of the plate 1. The whole layer 3' is covered with an overlying $SiO_2$ layer 4.

On the $SiO_2$ layer 4, the patterned second light-shielding layer 5C is formed. The layer 5C is made of amorphous silicon having a light-absorbing property. The layer 5C comprises lateral strip-shaped parts 5Ca extending along the rows (the X direction in FIG. 4) of the matrix of the TFTs 31 and vertical rectangular parts 5Cb extending along the columns (the Y direction in FIG. 4) thereof and intersecting with the lateral parts 5Ca. The strip-shaped parts 5Ca are arranged vertically (in the Y direction) at equal intervals, which are parallel to each other. The rectangular parts 5Cb are arranged horizontally (in the X direction) at equal intervals, which are parallel to each other. The layer 5C is patterned to entirely overlap with the underlying first light-shielding layer 3'. The layer 5C is covered with a $SiO_2$ layer 6 formed on the $SiO_2$ layer 4.

On the $SiO_2$ layer 6, the polysilicon active layers 7' are formed. Each of the layers 7' is patterned to have an approximately linear plan shape. Each of the layers 7' is located at a position near the intersection of a corresponding gate line 9 and a corresponding gate data line 11.

Each of the polysilicon active layers 7' comprises an undoped channel region 7c', two lightly-doped LDD regions 7b' and 7d', a heavily-doped source region 7a', and a heavily-doped drain region 7e'. The source and drain regions 7a' and 7e' are located at each side of the channel region 7c'. The LDD region 7b' is located between the source region 7a' and the channel region 7c'. The LDD region 7d' is located between the channel region 7c' and the drain region 7e'.

The source region 7a', the LDD region 7b', the channel region 7c', the LDD region 7d', and the drain region 7e' are arranged along the X direction in such a way as to overlap with the first and second light-shielding layers 3' and 5C.

A gate dielectric layer 8 is formed on the $SiO_2$ layer 6 to cover the underlying active layers 7'.

Gate lines 9 and gate electrodes 9a, both of which are made of impurity-doped polysilicon or silicide, are formed on the gate dielectric layer 8. The gate lines 9 are parallel to each other and extend in the X direction in such a way as not to overlap with the active layers 7' of the TFTs 31. Instead, the gate electrodes 9a are formed to overlap with the corresponding channel regions 7c' of the respective TFTs 31. The gate electrodes 9a are mechanically and electrically connected to the corresponding gate lines 9. The gate lines 9 and the gate electrodes 9a are entirely covered with a first interlayer dielectric layer 10 formed on the layer 8.

Data lines 11, which are made of Al, are formed on the first interlayer dielectric layer 10. These lines 11 are parallel to each other and extend in the Y direction. Each of the lines 11 is located to overlap with the active layers 7' of the TFTs 31 that belong to the same column of the matrix. The line 11 covers entirely the source regions 7a' of the corresponding TFTs 31. The line 11 is mechanically contacted with and electrically connected to the source regions 7a' of the TFTs 31 that belong to the same row of the matrix by way of contact holes 21 that penetrate the first interlayer dielectric layer 10 and the gate dielectric layer 8. The lines 11 are entirely covered with a second interlayer dielectric layer 12.

The patterned black matrix layer 13', which is made of Cr, is formed on the second interlayer dielectric layer 12. The plan shape of the layer 13' is like a lattice, which is formed by lateral strips extending along the rows (the X direction in FIG. 4) of the matrix and vertical strips extending along the columns (the Y direction in FIG. 4) thereof and intersecting with the lateral ones. The layer 13' is patterned to overlap with the gate lines 9, the gate electrodes 9a, and the data lines 11. The rectangular parts of the layer 13', which protrude laterally to overlap with the pixel electrodes 20, cover the corresponding TFTs 31. The layer 13' serves as the third light-shielding layer. The layer 13' is entirely covered with a third interlayer dielectric layer 14 formed on the layer 12.

Pixel electrodes 15, which have an approximately rectangular plan shape, are formed on the third interlayer dielectric layer 14. The electrodes 15 are located in corresponding pixel areas 20 defined by the gate lines 9 and the data lines 11. The electrodes 15 are mechanically contacted with and electrically connected to the drain regions 7e' of the corresponding TFTs 31 by way of contact holes 22 that penetrate the third interlayer dielectric layer 14, the second interlayer dielectric layer 12, the first interlayer dielectric layer 10, and the gate dielectric layer 8.

Figure 17:
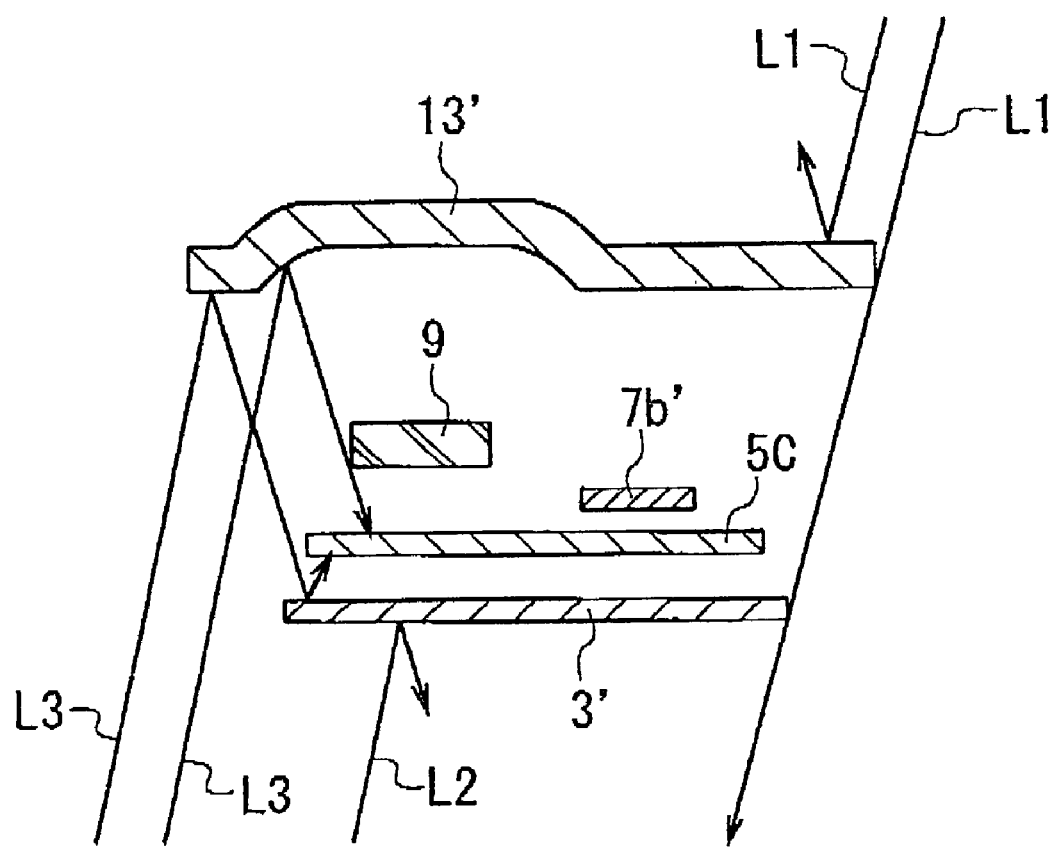
FIG. 17 is a schematic cross-sectional view showing the effect to block the light entering the inside of the substrate of FIG. 15, which is along the line XVIA—XVIA in FIG. 15.

With the TFT array substrate 30C according to the fourth embodiment, the same advantages as those in the first embodiment are obtainable. Specifically, as shown in FIG. 17, the light L1 entering the LCD device from the side of the opposite substrate 52 is blocked by the black matrix layer (i.e., the third light-shielding layer) 13'. Alternately, the light L1 penetrates the substrate 30C without reflection by the first light-shielding layer 3'. This is because the widths of the layers 13' and 3' and the interval between the layers 13' and 3' are well adjusted for this purpose.

On the other hand, the light L2 entering the LCD device from the side of the TFT array substrate 30C (51) is blocked by the first light-shielding layer 3'. The light L3 entering from the side of the substrate 30C toward the black matrix layer 13' is reflected by the layer 13' to go to the first light-shielding layer 3'. Then, the light L3 reaches the second light-shielding layer 5C located between the layer 3' and the TFTs 31. Alternately, the light L3 is reflected by the layer 13' and 3' and then, the light L3 reaches the second light-shielding layer 5C. Since the second light-shielding layer 5C is made of amorphous Si having a light-absorbing property, the light L1 to Le are absorbed by the layer 5C.

In this way, even if light traveling from the side of the plate 1 is reflected by the third patterned light-shielding layer (i.e., the black matrix layer) 13' and then, reflected by the first light-shielding layer 3', the light will be absorbed by the second light-shielding layer 5C. Thus, any light traveling toward the channel region 7c' and the LDD regions 7b' and 7d' of each TFT 31 is blocked effectively and certainly.

In addition, the channel region 7c' of each TFT 31 is covered with the corresponding one of the gate electrodes 9a and therefore, the effect to block the light traveling toward the region 7c' is enhanced.

The substrate 30C is fabricated in substantially the same method as used in the first embodiment.

With the TFT array substrate 30C according to the fourth embodiment, the same advantages as those in the first embodiment are obtainable. Specifically, any light traveling toward the channel region 7c' and the LDD regions 7b' ad 7d' of the TFTs 31 in the substrate 30C is effectively blocked. This means that these regions 7c', 7b' and 7d' are not exposed to the light. As a result, the optically induced current leakage in the TFTs 31 is suppressed, thereby improving the contrast and uniformity of image quality. Moreover, the substrate 30C can be fabricated easily without complicated process steps.

Fifth Embodiment

Figure 18:
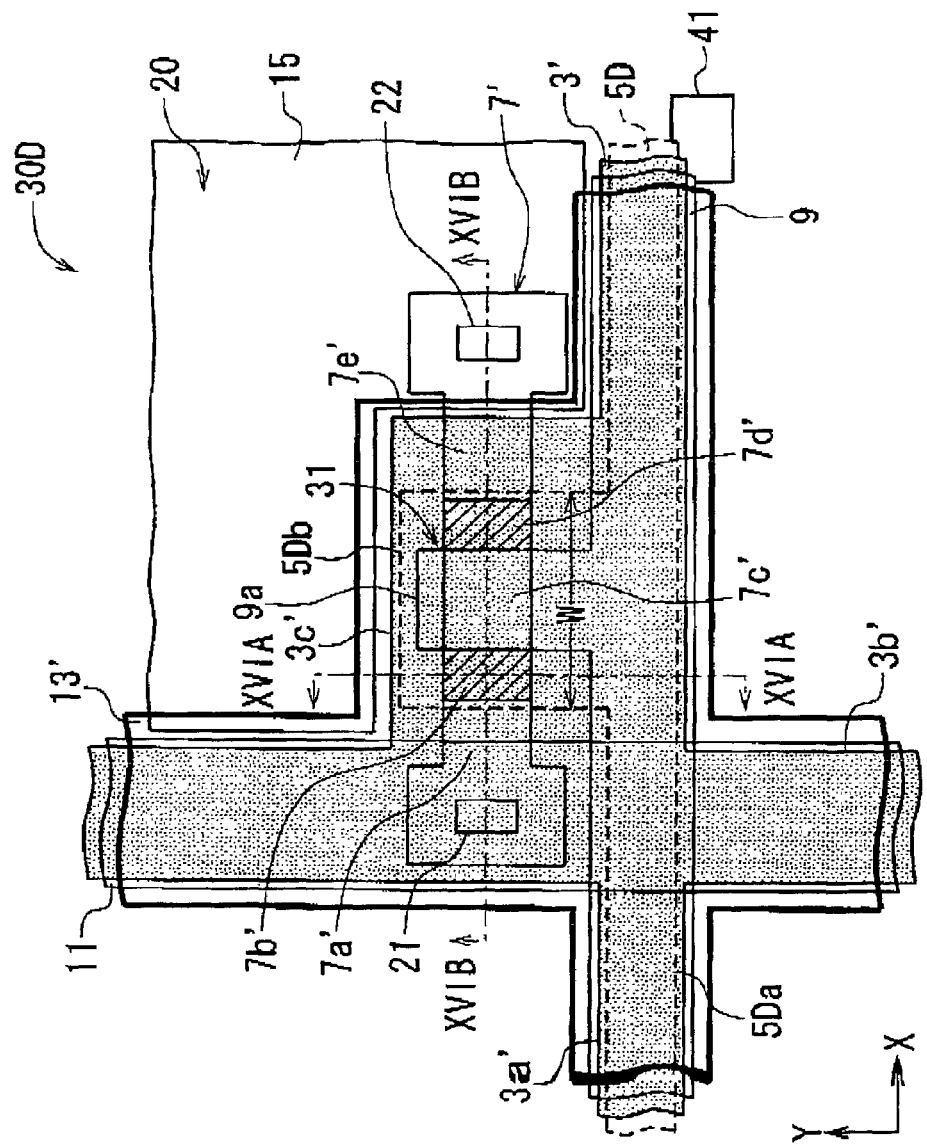
FIG. 18 is a partial plan view showing the layout of a TFT array substrate according to a fifth embodiment of the invention.

FIG. 18 shows the structure of a TFT array substrate 30D according to a fifth embodiment of the invention, in which only one pixel is illustrated for simplification.

The substrate 30D of the fifth embodiment has the same configuration as the substrate 30C of the fourth embodiment, except that a second light-shielding layer 5D has conductivity and electrically connected to the corresponding gate lines 9. Therefore, the explanation about the same configuration is omitted here for the sake of simplification by attaching the same reference symbols as used in the fourth embodiment of FIGS. 15 and 16A to 16B to the same or corresponding elements in the fifth embodiment of FIG. 18.

In the substrate 30D, the second light-shielding layer 5D is made of an impurity-doped polysilicon. The layer 5D has strip-shaped first parts 5Da extending along the rows of the matrix (i.e., in the X direction) and rectangular second parts 5Db extending along the columns of the matrix (i.e., in the Y direction). The first parts 5Da are parallel to each other. The second parts 5Db, which laterally protrude over the pixel regions 20, are overlapped with the respective polysilicon active layers 7'. The layer 5D is formed in such a way as to overlap with the first light-shielding layer 3'.

The second light-shielding layer 5D is electrically connected to the corresponding gate lines 9 by way of internal wiring lines 41, like the second embodiment. Therefore, the gate electrodes 9a serve as first gate electrodes of the TFTs 31 and at the same time, the layer 5D serves as the common second gate electrode thereof. This means that the TFTs 31 serve as dual-gate FETs.

In this way, with the substrate 30D of the fifth embodiment, the second light-shielding layer 5D is used as the common second gate electrode and therefore, the inter-electrode capacitance of the TFTs 31 increases. To suppress the increase of the inter-electrode capacitance, the width W of the second part 5Db in the X direction is decreased compared with the fourth embodiment.

Specifically, the second part 5Db of the second light-shielding layer 5D is overlapped with the channel region 7c', and the LDD regions 7b' and 7d' of the TFT 31 while it is scarcely overlapped with the source and drain regions 7a' and 7e'. Due to this structure, the increase of the inter-electrode capacitance of the TFT 31 can be suppressed at a level where no problem occurs practically while keeping the effect to block the light traveling toward the channel and LDD regions 7c', 7b', and 7d'.

The substrate 30d is fabricated in substantially the same method as used in the first embodiment.

With the TFT array substrate 30D according to the FIFTH embodiment, the same advantages as those in the first embodiment are obtainable. Specifically, any light traveling toward the channel region 7c' and the LDD regions 7b' and 7d' of the TFTs 31 in the substrate 30D is effectively blocked. As a result, the optically induced current leakage in the TFTs 31 is suppressed, thereby improving the contrast and uniformity of image quality. Moreover, the substrate 30D can be fabricated easily without complicated process steps.

The substrate 30D has an additional advantage that an improved on/off characteristic of the TETs 31 is obtainable, because the TFTs 31 serve as dual-gate FETs. This is the same as the second embodiment.

Sixth Embodiment

Figure 19:
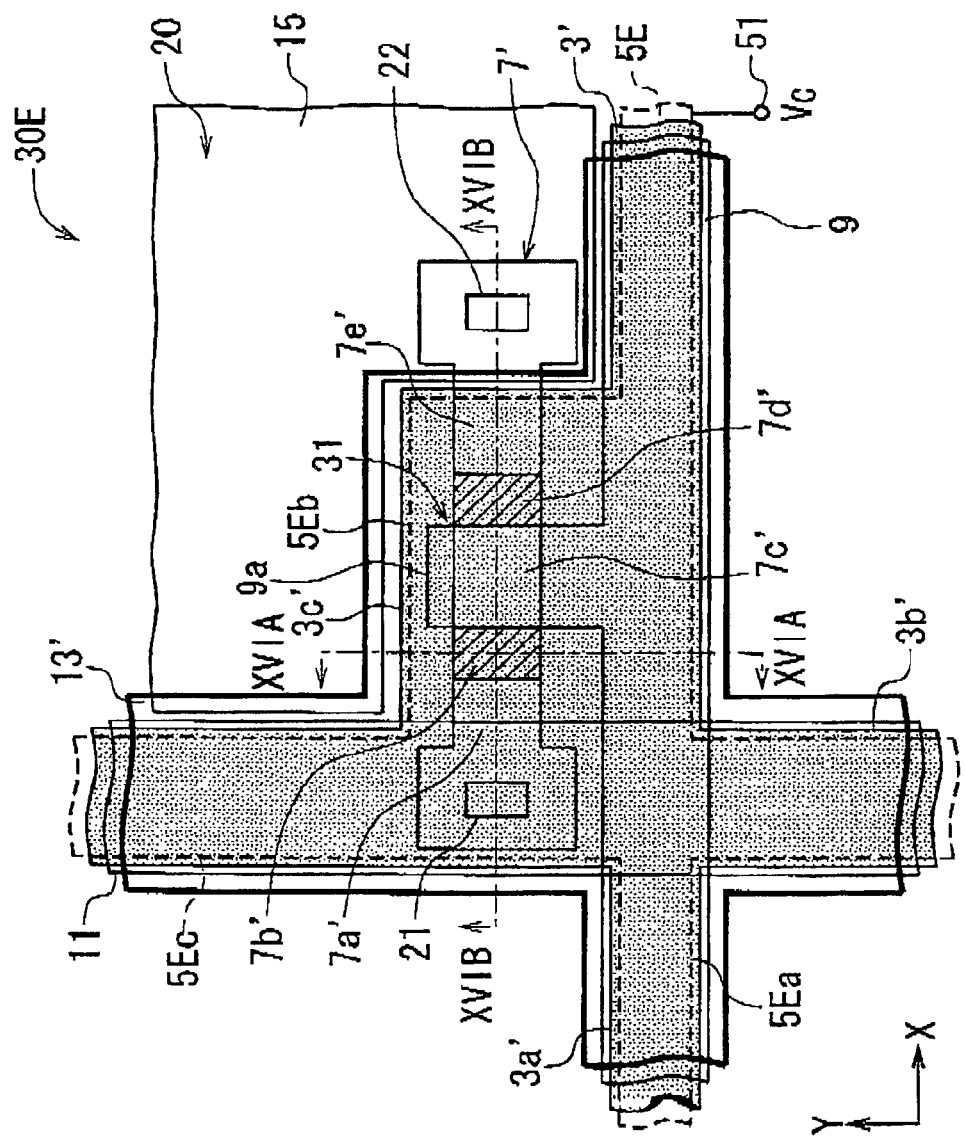
FIG. 19 is a partial plan view showing the layout of a TFT array substrate according to a sixth embodiment of the invention.

FIG. 19 shows the structure of a TFT array substrate 30E according to a sixth embodiment of the invention, in which only one pixel is illustrated for simplification.

The substrate 30E of the sixth embodiment has the same configuration as the substrate 30C of the fourth embodiment, except that a second light-shielding layer 5E has conductivity and is applied with a constant voltage $V_c$. Therefore, the explanation about the same configuration is omitted here for the sake of simplification by attaching the same reference symbols as used in the fourth embodiment of FIGS. 15 and 16A to 16B to the same or corresponding elements in the sixth embodiment of FIG. 19.

In the substrate 30E, the second light-shielding layer 5E, which is made of an impurity-doped polysilicon, is formed on the $SiO_2$ layer 4. The second light-shielding layer 5E has strip-shaped first parts 5Ea extending along the rows of the matrix (i.e., in the X direction), rectangular second parts 5Eb, and strip-shaped third parts 5Ec extending along the columns of the matrix (i.e., in the Y direction). The first and third parts 5Ea and 5Ec are intersected with each other to thereby constitute a lattice-like plan shape. The second parts 5Eb are located at the respective intersections of the parts 5Ea and 5Ec and protruded over the pixel regions 20. The layer 5E is formed in such a way as to overlap with the first light-shielding layer 3'. The second parts 5Eb are overlapped with the polysilicon active layers 7'.

The second light-shielding layer 5E is electrically connected to an external terminal 51 through which a constant voltage $V_c$ is supplied to the layer 5E, like the substrate 30B of the third embodiment. Thus, the layer 5E is biased at the voltage $V_c$. By adjusting the value of the voltage $V_c$, the characteristic of the TFT 31 can be controlled as desired.

The substrate 30E is fabricated in substantially the same method as used in the first embodiment.

With the TFT array substrate 30E according to the sixth embodiment, the same advantages as those in the first embodiment are obtainable. Specifically, any light traveling toward the active layers 7 (especially, the channel region 7c' and the LDD regions 7b' and 7d') of the TFTs 31 in the substrate 30E is effectively blocked. As a result, the optically induced current leakage in the TFTs 31 is suppressed, thereby improving the contrast and uniformity of image quality. Moreover, the substrate 30E can be fabricated easily without complicated process steps.

The substrate 30E has an additional advantage that the characteristic at the TFTs 31 is controllable by adjusting the value of the voltage VC applied to the second light-shielding layer 5B, like the substrate 30B of the third embodiment.

Seventh Embodiment

In the above-described first to sixth embodiments, the second light-shielding layer 5 is provided between the first light-shielding layer 3 and the TFTs 31, in addition to the first light-shielding layer 3 and the third light-shielding layer (i.e., the black matrix layer) 13, thereby enhancing the light-shielding effect.

In the following seventh to tenth embodiments of the invention, a fourth light-shielding layer 16 or 16' is provided between the TFTs 31 and the third light-shielding layer (black matrix layer) 13 to enhance the light-shielding effect. As seen from these embodiments, even if the fourth light-shielding layer 16 or 16' is provided on the opposite side to the plate 1 with respect to the TFTs 31, any light traveling toward the active layers 7 of the TFTs 31 is effectively blocked or suppressed, similar to the case of the second light-shielding layer 5.

Figure 21A:
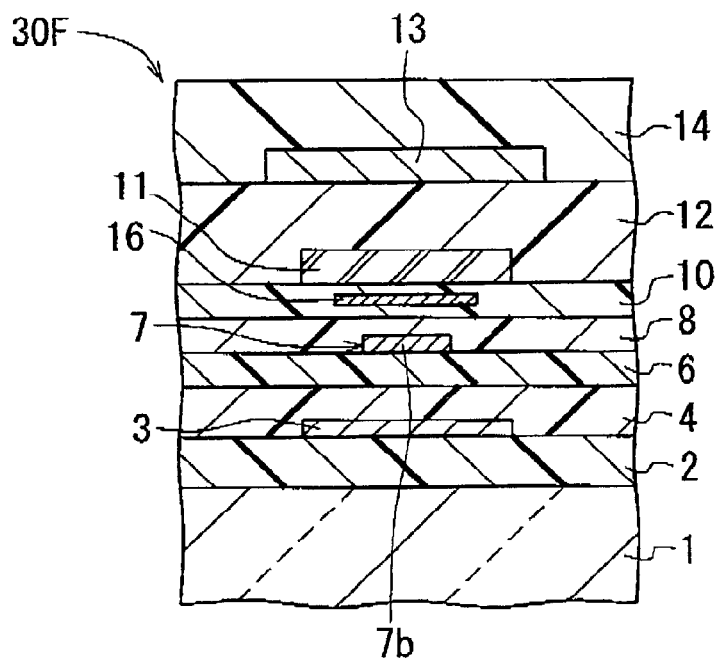
FIG. 21A is a partial, cross-sectional view along the line VA—VA in FIG. 4, which shows the structure of a TFT array substrate according to a seventh embodiment of the invention.
Figure 21B:
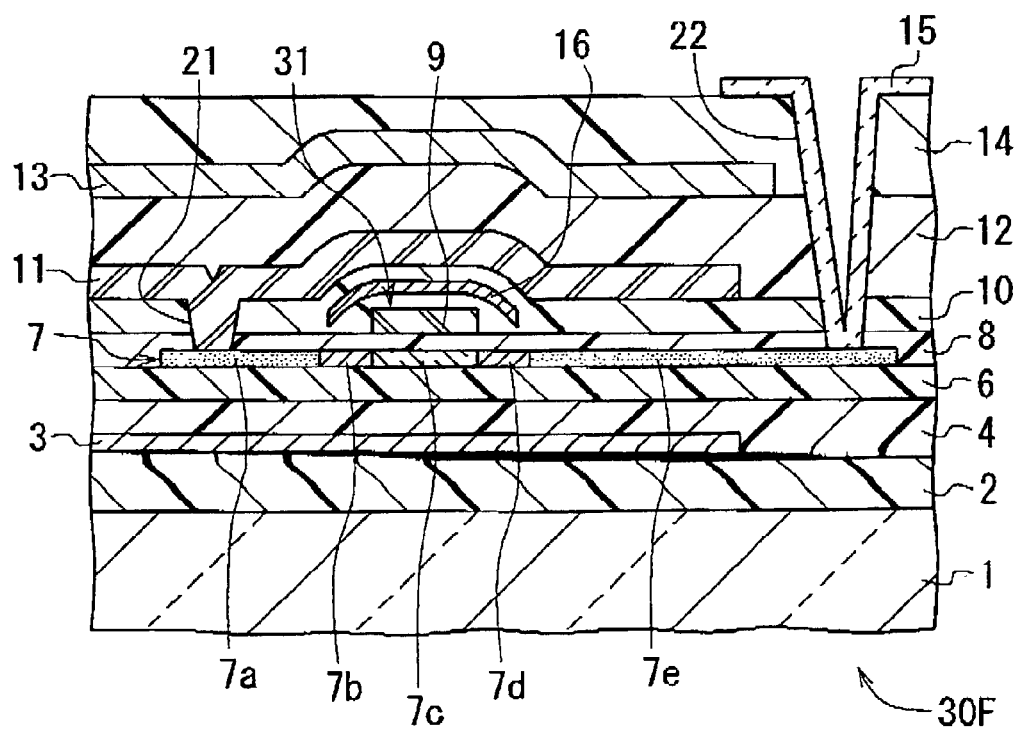
FIG. 21B is a partial, cross-sectional view along the line VB—VB in FIG. 4, which shows the structure of the substrate of FIG. 21A.

FIGS. 21A and 21B show the structure of a TFT array substrate 30F according to a seventh embodiment of the invention, which are along the lines VA—VA and VB—VB in FIG. 4, respectively.

The substrate 30F of the seventh embodiment is obtained by canceling the second light-shielding layer 5 from the TFT array substrate 30 of the first embodiment of FIGS. 4, 5A and 5B and by adding the fourth light-shielding layer 16 thereto. The other structure of the substrate 30F is the same as the substrate 30. Since the second light-shielding layer 5 is canceled, the $SiO_2$ layer 4 or 6 may be canceled in the TFT array substrate 30.

The pattern or plan shape of the fourth light-shielding layer 16 is the same as the second light-shielding layer 5 shown in FIG. 4, which covers almost all the polysilicon active layer 7 of each TFT 31. The layer 16 does not cover the part of the layer 7 near the contact hole 22.

The fourth light-shielding layer 16 is buried in the first interlayer dielectric layer 10. This is realizable easily if the layer 10 has a two-layer structure. Specifically, after the lower part of the layer 10 is formed, an amorphous silicon layer for the layer 16 is formed on the lower part. Then, the amorphous silicon layer is patterned to form the layer 16. Finally, the upper part of the layer 10 is formed.

However, the invention is not limited to the structure shown in FIGS. 21A and 21B. For example, the fourth light-shielding layer 16 may be formed on the first interlayer dielectric layer 10 and then, an additional dielectric layer may be formed to cover the layer 16. Finally, the second interlayer dielectric layer 12 may be formed to cover the additional dielectric layer.

Eighth Embodiment

Figure 22A:
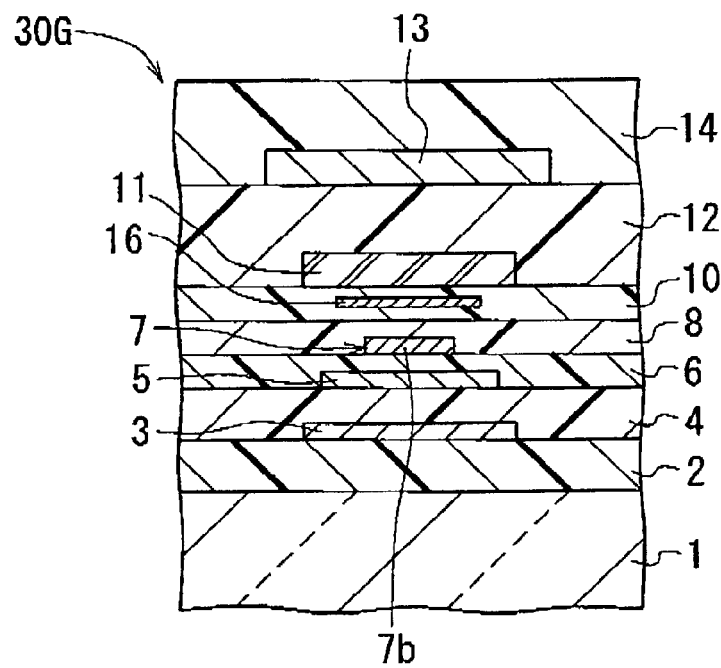
FIG. 22A is a partial, cross-sectional view along the line VA—VA in FIG. 4, which shows the structure of a TFT array substrate according to an eighth embodiment of the invention.
Figure 22B:
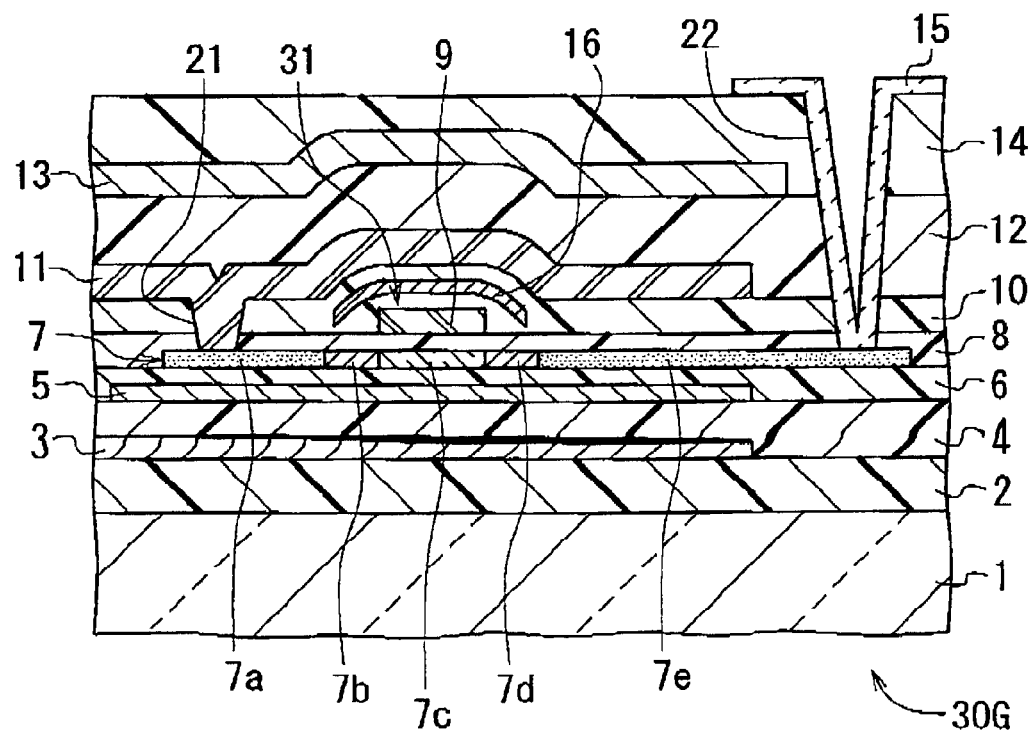
FIG. 22B is a partial, cross-sectional view along the line VB—VB in FIG. 4, which shows the structure of the substrate of FIG. 22A.

FIGS. 22A and 22B show the structure of a TFT array substrate 30G according to an eighth embodiment of the invention, which are along the lines VA—VA and VB—VB in FIG. 4, respectively.

The substrate 30G of the eighth embodiment is obtained by adding the fourth light-shielding layer 16 to the TFT array substrate 30 or the first embodiment of FIGS. 4, 5A and 5B. The other structure of the substrate 30G is the same as the substrate 30. It may be said that the substrate 30G is obtained by adding the second light-shielding layer 5 to the substrate 30F of the seventh embodiment of FIGS. 21A and 21B.

Since the fourth and second light-shielding layers 16 and 5 are provided at each side (i.e., at the top and bottom) of the TFTs 31, the light-shielding effect is obtainable at each side of the TFTs 31. Thus, there is an additional advantage that a higher light-shielding effect is obtainable than the first and seventh embodiments.

Ninth Embodiment

Figure 23A:
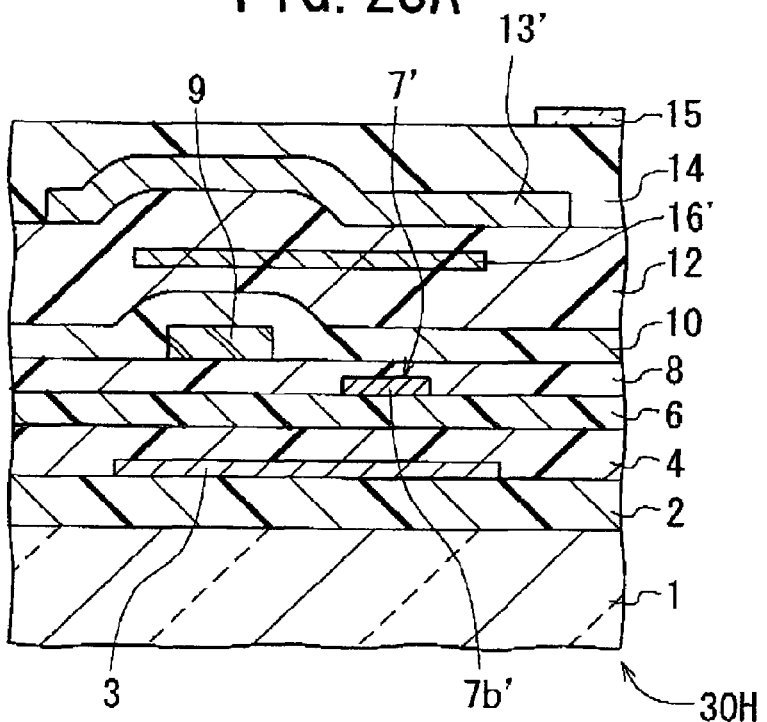
FIG. 23A is a partial, cross-sectional view along the line XVIA—XVIA in FIG. 15, which shows the structure of a TFT array substrate according to a ninth embodiment of the invention.
Figure 23B:
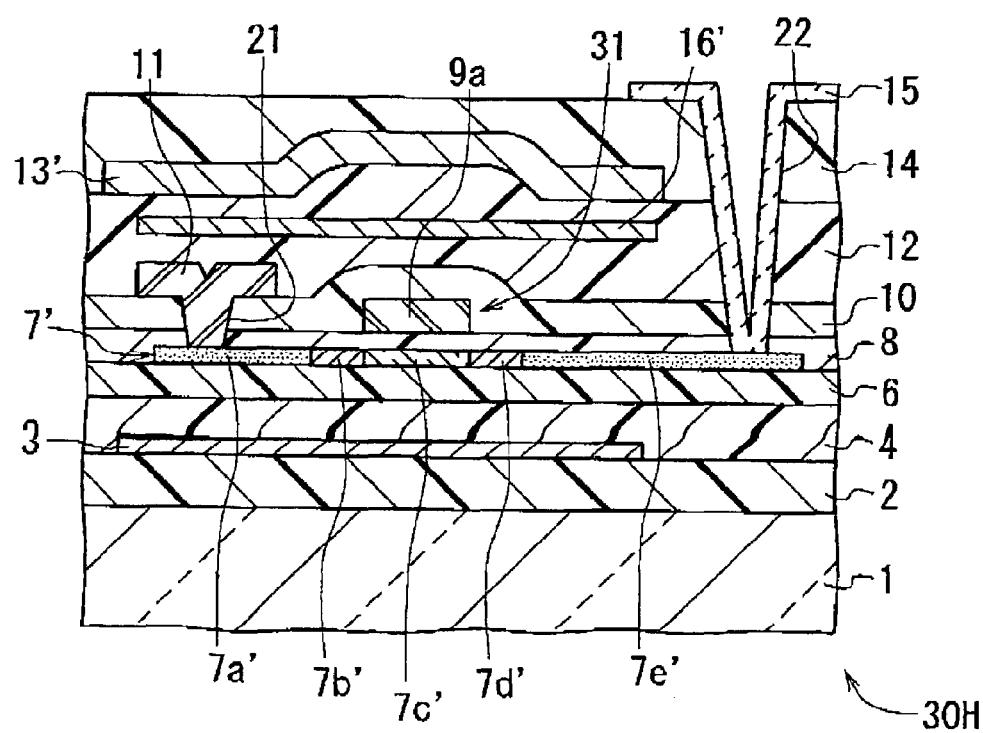
FIG. 23B is a partial, cross-sectional view along the line XVIB—XVIB in FIG. 15, which shows the structure of the substrate of FIG. 23A.

FIGS. 23A and 23B show the structure of a TFT array substrate 30H according to a ninth embodiment of the invention, which are along the lines XVIA—XVIA and XVIB—XVIB in FIG. 15, respectively.

The substrate 30H of the ninth embodiment is obtained by canceling the second light-shielding layer 5C from the TFT array substrate 30C of the fourth embodiment of FIGS. 16A and 16B and by adding the fourth light-shielding layer 16' thereto. The other structure of the substrate 30H is the same as the substrate 30C. Since the second light-shielding layer 5C is canceled, the $SiO_2$ layer 4 or 6 may be canceled in the TFT array substrate 30C.

The pattern or plan shape of the fourth light-shielding layer 16' is the same as the second light-shielding layer 5C shown in FIG. 15, which covers almost all the polysilicon active layer 7 of each TFT 31. The layer 16' does not cover the part of the layer 7 near the contact hole 22.

The fourth light-shielding layer 16' is buried in the second interlayer dielectric layer 12. This is realizable easily if the layer 12 has a two-layer structure. Specifically, after the lower part of the layer 12 is formed, an amorphous silicon layer for the layer 16' is formed on the lower part. Then, the amorphous silicon layer is patterned to form the layer 16'. Finally, the upper part of the layer 12 is formed.

However, the invention is not limited to the structure shown in FIGS. 23A and 23B. For example, the fourth light-shielding layer 16' may be formed on the second interlayer dielectric layer 12 and then, an additional dielectric layer may be formed to cover the layer 16'. Finally, the third interlayer dielectric layer 14 may be formed to cover the additional dielectric layer.

Tenth Embodiment

Figure 24A:
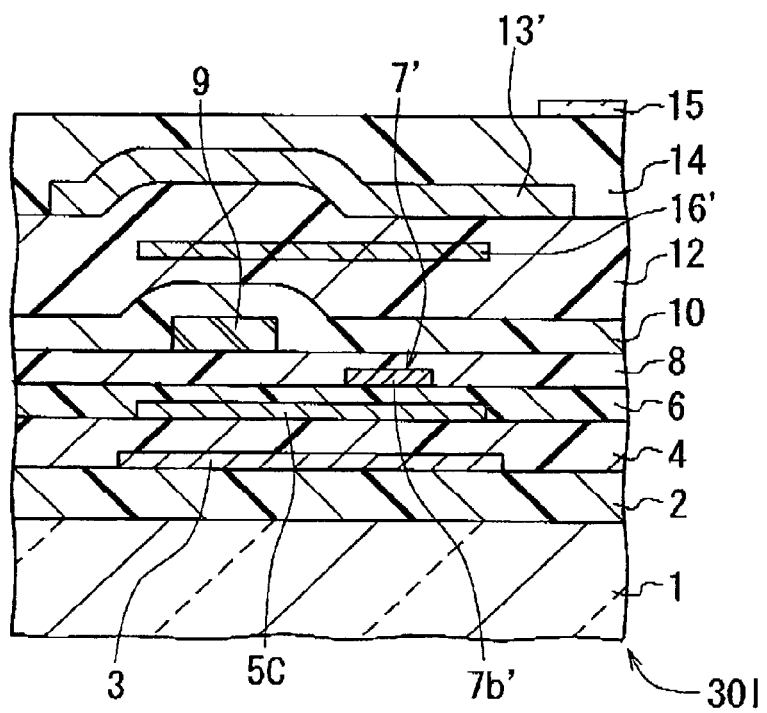
FIG. 24A is a partial, cross-sectional view along the line XVIA—XVIA in FIG. 15, which shows the structure of a TFT array substrate according to a tenth embodiment of the invention.
Figure 24B:
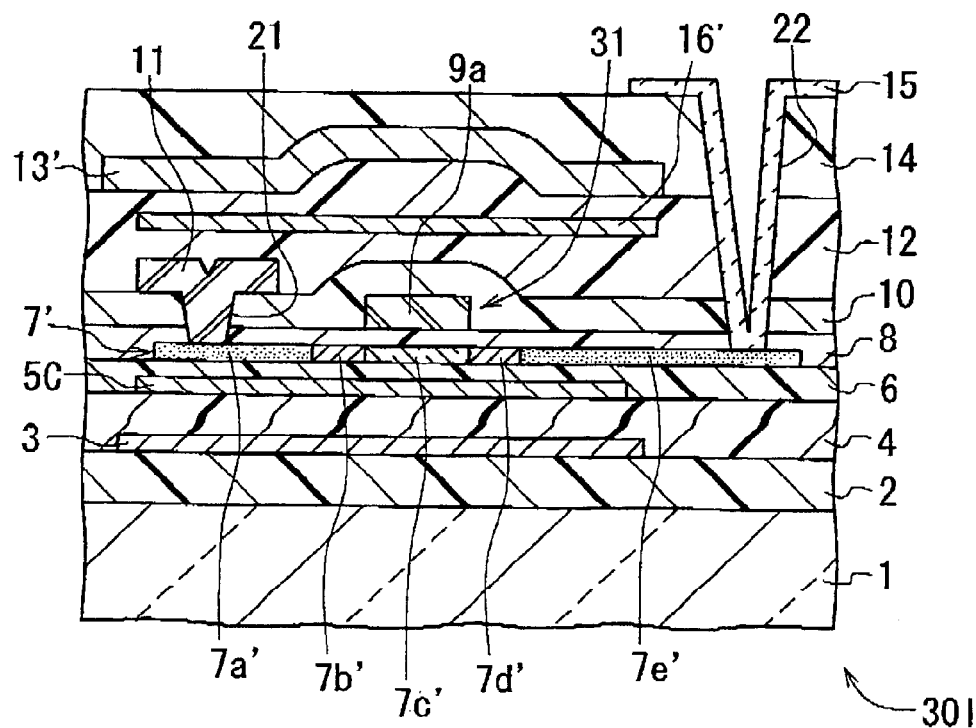
FIG. 24B is a partial, cross-sectional view along the line XVIB—XVIB in FIG. 15, which shows the structure of the substrate of FIG. 24A.

FIGS. 24A and 24B show the structure of a TFT array substrate 30I according to a tenth embodiment of the invention, which are along the lines VA—VA and VB—VB in FIG. 4, respectively.

The substrate 30I of the tenth embodiment is obtained by adding the fourth light-shielding layer 16' to the TFT array substrate 30C of the fourth embodiment of FIGS. 15, 16A and 16B. The other structure of the substrate 30I is the same as the substrate 30C. It may be said that the substrate 30I is obtained by adding the second light-shielding layer 5C to the substrate 30H of the ninth embodiment of FIGS. 23A and 23B.

Since the fourth and second light-shielding layers 16' and 5C are provided at each side (i.e., at the top and bottom) of the TFTs 31, the light-shielding effect is obtainable at each side of the TFTs 31. Thus, there is an additional advantage that a higher light-shielding effect is obtainable than the first and seventh embodiments.

Figure 25:
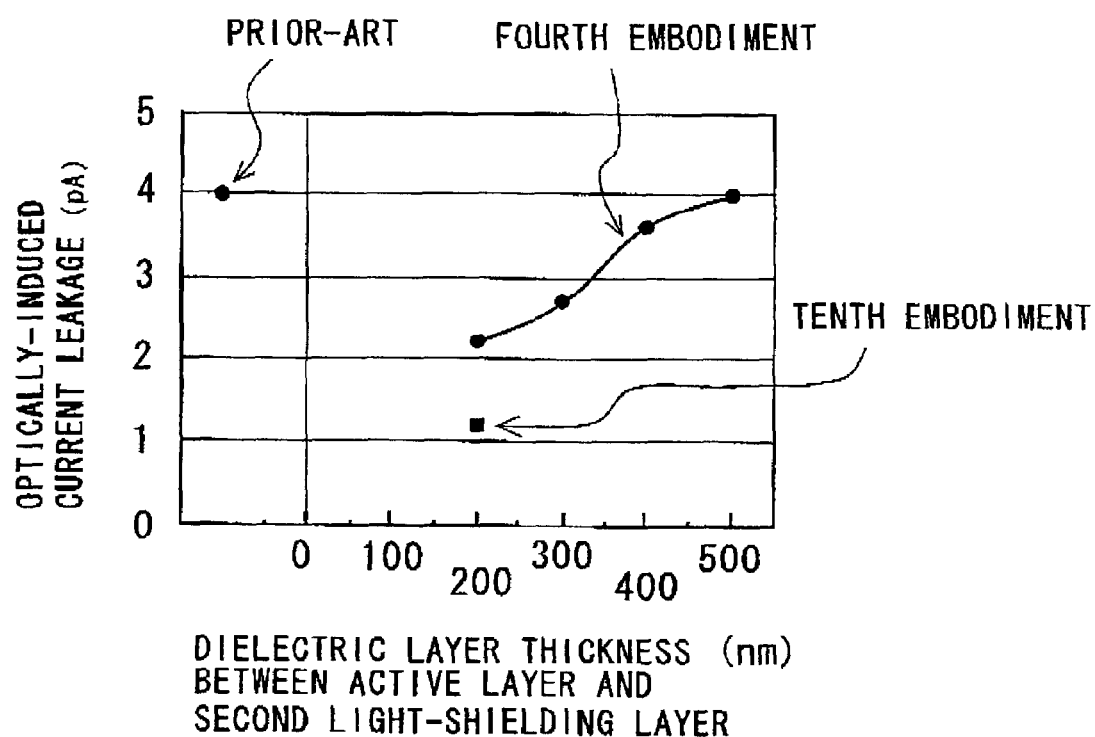
FIG. 25 shows a graph showing the relationship of the optically induced current leakage of the TFTs provided in the pixel matrix section with the dielectric layer thickness between the active layer and the second light-shielding layer, which was obtained under a specific irradiation condition of projection light.

FIG. 25 shows the relationship of the optically induced current leakage of the TFTs 31 provided in the pixel matrix section with the dielectric layer thickness between the active layer and the second light-shielding layer, which was obtained under a specific irradiation condition of projection light.

As seen from FIG. 25, with the prior-art TFT array substrate 100 (see FIGS. 1, 2A and 2B) having only the first and third light-shielding layers, the optically induced current leakage is 4 pA. On the other hand, with the TFT array substrate 30C (see FIGS. 15, 16A and 16B) having the second light-shielding layer along with the first and third light-shielding layers according to the fourth embodiment of the invention, the optically induced current leakage decreases gradually as the dielectric layer thickness between the active layer and the second light-shielding layer is reduced from 500 nm. At the maximum, the value of the leakage decreases to approximately ($\frac{1}{3}$) of the value of the prior-art substrate 100.

Moreover, as seen from FIG. 25, the effect to decrease the current leakage had a correlation with the dielectric layer thickness between the active layer and the second light-shielding layer. As this thickness was decreased from 500 nm, this effect increased. However, although not shown in FIG. 25, the thickness was set at values less than 100 nm, the ON characteristic of the TFTs 31 and the crystallinity of the active layers 7 in the laser annealing process were affected largely and as a result, the TFTs 31 were unable to operate normally due to deterioration of the ON characteristic of the TFTs 31. According to this test result, it was found that the dielectric layer thickness in question was preferably set at values in the range from 500 nm to 100 nm.

With the TFT array substrate 30I (see FIGS. 24A and 24B) having the second and fourth light-shielding layers along with the first and third light-shielding layers according to the tenth embodiment of the invention, the value of the optically induced current leakage decreased to approximately ($\frac{1}{2}$) of, the value of the substrate 30C according to the fourth embodiment. Thus, by adding the fourth light-shielding layer along with the second light-shielding layer, it was confirmed that a higher effect to suppress the leakage was obtained.

Eleventh Embodiment

In general, when laser light is irradiated to an amorphous silicon layer to form a polysilicon active layer (in other words, when a polysilicon active layer is obtained from an amorphous silicon layer by the laser annealing process), the heating and cooling process by the laser light irradiation will change from its desired one, if a substance with a high thermal conductivity exists directly below the amorphous silicon layer. As a result, there arises a problem that the crystallization process of the amorphous silicon layer is fairly affected. To avoid this problem, conventionally, it was typical that a dielectric layer with a sufficient thickness is located between the amorphous silicon layer and the thermally conductive substance, thereby keeping them sufficiently apart.

Figure 26:
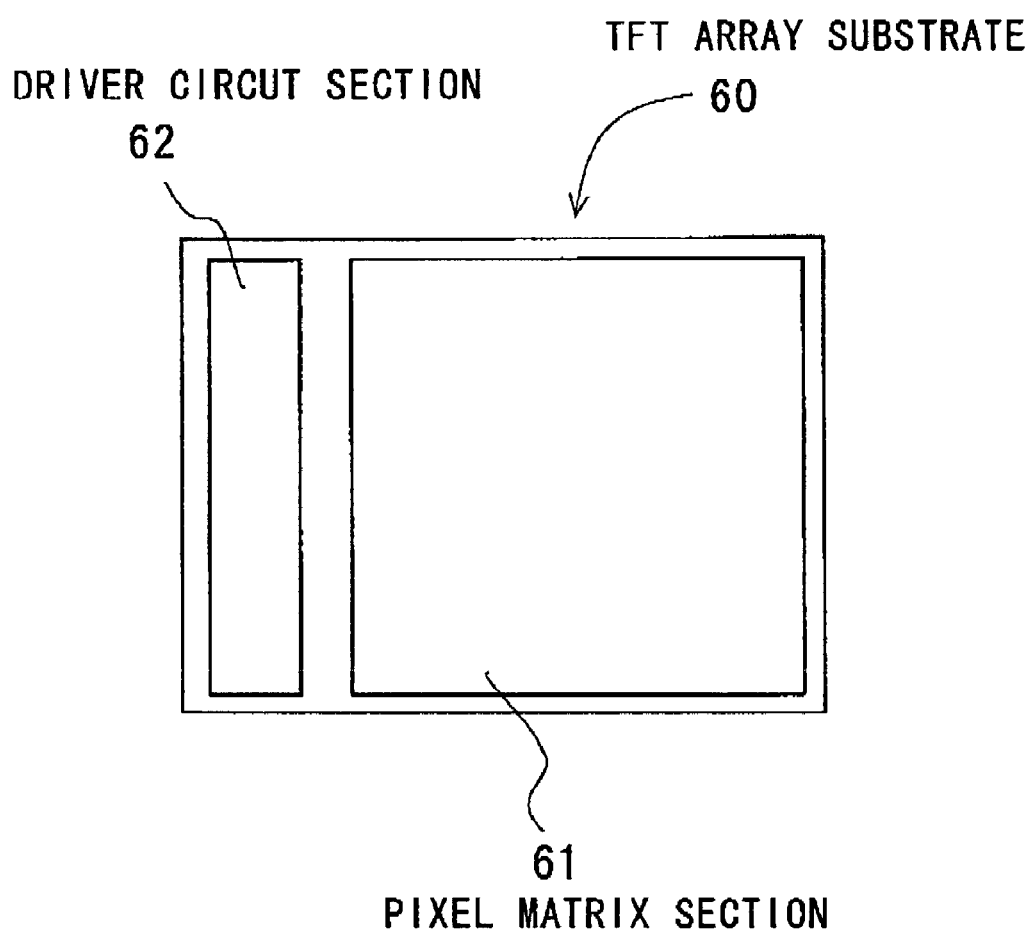
FIG. 26 is a schematic plan view of a TFT array substrate according to an eleventh embodiment of the invention.

On the other hand, it is known that pixel matrix section 61 and the driver circuit section 62 may be formed on the same substrate, like a TFT array substrate 60 shown in FIG. 26. In this case, the TFTs in the driver circuit section 62 necessitate high mobility in transistor characteristics. Unlike this, the TFTs in the pixel matrix section 61 do not necessitate high mobility; they necessitate low current leakage in transistor characteristics. To decrease the optically induced current leakage, it is preferred that the silicon material contains comparatively many traps that serve as the recombination centers. Taking this into consideration, it is preferred for the TFTs in the pixel matrix section 61 that the polysilicon material has low crystallinity.

Accordingly, with the TFT array substrate 60 according to the eleventh embodiment of the invention, the TFTs 31 having the second and/or fourth light-shielding layer(s) according to the first to tenth embodiments are used for the pixel matrix section 61. At the same time as this, for the driver circuit section 62, TFTs not having the second and/or fourth light-shielding layer(s) are used. In this way, with the TFTs in the section 61, the laser-inducing heat can be propagated quickly with the second and/or fourth light-shielding layer(s). As a result, the polysilicon layers with low crystallinity are formed for only the active layers of the TFTs in the pixel matrix section 61. This means that the optically induced current leakage can be suppressed furthermore because of not only existence of the second and/or fourth light-shielding layer(s) but also the crystallinity level of the polysilicon layer.

Variations

Needless to say, the present invention is not limited to the above-described first to eleventh embodiments, because these embodiments are preferred ones of the invention. Any change or modification may be added to them within the spirit of the invention.

For example, in the first to sixth embodiments, the first light-shielding layer 3 is formed over the transparent plate 1 by way of the $SiO_2$ layer 2. However, the first light-shielding layer 3 may be formed directly on the transparent plate 1 without the $SiO_2$ layer 2, according to the material of the plate 1. In the third and sixth embodiments, the second light-shielding layers 5B and 5E may be made of amorphous Si, and at the same time, the constant voltage $V_c$ may not be applied to the layers 5B and 5E. In the first and fourth embodiments, the second light-shielding layers 5 and 5C may be made of polysilicon. In the second, third, fifth, and sixth embodiments, the second light-shielding layers 5A, 5B, 5D and 5E may be made of impurity-doped amorphous Si. These are applicable to the seventh to eleventh embodiments.

The second and fourth light-shielding layers may be made of any other material than the above-described material if it absorbs light to be applied to the TFT array substrate.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A TFT array substrate comprising:
   (a) a transparent plate;
   (b) TFTs arranged on the plate in a matrix array with rows and columns,
     each of the TFTs having a first source/drain region, a second source/drain region, and an active layer;
   (c) gate lines formed on the plate in such a way as to extend along the rows of the matrix;
   (d) data lines formed on the plate in such a way as to extend along the columns of the matrix,
     each of the data lines being electrically connected to corresponding ones of the TFTs at their first source/drain regions;
   (e) pixel electrodes formed in pixel areas on the plate,
     each of the pixel electrodes being electrically connected to corresponding ones of the TFTs at their second source/drain regions;
   (f) a patterned first light-shielding layer formed between the plate and the TFTs in such a way as to overlap with the active layers of the TFTs;
   (g) a patterned second light-shielding layer formed between the first light-shielding layer and the TFTs,
     the second light-shielding layer having a light-absorbing property; and
   (h) a patterned third light-shielding layer formed to cover the TFTs on an opposite side to the plate with respect to the TFTs,
     the third light-shielding layer having first parts extending along the rows of the matrix and second parts extending along the columns thereof.

2. The substrate according to claim 1, wherein each of the TFTs has a channel region and a LDD region;
   the second light-shielding layer having first parts covering the channel regions of the TFTs and second parts covering the LDD regions thereof.

3. The substrate according to claim 1, wherein the second light-shielding layer is made of a material including silicon.

4. The substrate according to claim 1, wherein the second light-shielding layer has conductivity;
   the second light-shielding layer having a structure that allows application of a constant voltage.

5. The substrate according to claim 1, wherein the second light-shielding layer has conductivity and/is connected electrically to the gate lines.

6. The substrate according to claim 1, wherein the second light-shielding layer is made of silicon doped with an impurity.

7. The substrate according to claim 1, wherein the gate lines are arranged in such a way as to overlap with the channel regions of the corresponding TFTs;
   and wherein the gate lines have a function of gate electrodes of the TFTs at their overlapping parts.

8. The substrate according to claim 1, further comprising gate electrodes formed for the respective TFTs separately from the gate lines;
   wherein the gate lines are electrically connected to the corresponding gate electrodes.

9. The substrate according to claim 1, wherein a dielectric sandwiched by the second light-shielding layer and the active layers of the TFTs has a thickness ranging from 100 nm to 500 nm.

10. The substrate according to claim 1, wherein a dielectric sandwiched by the second light-shielding layer and the active layers of the TFTs has a thickness ranging from 150 nm to 300 nm.

11. The substrate according to claim 1, wherein a driver circuit section including TFTs is provided in addition to a pixel matrix section where the TFTs are arranged in a matrix array;
   and wherein the second light-shielding layer is provided for the TFTs in the pixel matrix section while the second light-shielding layer is not provided for the TFTs in the driver circuit section.

12. An active-matrix addressing LCD device comprising:
   (a) a TFT array substrate according to claim 1;
   (b) an opposite substrate located to be opposite to the TFT array substrate; and
   (c) a liquid-crystal layer formed between the TFT array substrate and the opposite substrate.

13. A TFT array substrate comprising:
(a) a transparent plate;
(b) TFTs arranged on the plate in a matrix array with rows and columns,
each of the TFTs having a first source/drain region, a second source/drain region, and an active layer;
(c) gate lines formed on the plate in such a way as to extend along the rows of the matrix;
(d) data lines formed on the plate in such a way as to extend along the columns of the matrix,
each of the data lines being electrically connected to corresponding ones of the TFTs at their first source/drain regions;
(e) pixel electrodes formed in pixel areas on the plate,
each of the pixel electrodes being electrically connected to corresponding ones of the TFTs at their second source/drain regions;
(f) a patterned first light-shielding layer formed between the plate and the TFTs in such a way as to overlap with the active layers of the TFTs;
(g) a patterned third light-shielding layer formed to cover the TFTs on an opposite side to the plate with respect to the TFTs,
the third light-shielding layer having first parts extending along the rows of the matrix and second parts extending along the columns thereof; and
(h) a patterned fourth light-shielding layer formed between the TFTs and the third light-shielding layer,
the fourth light-shielding layer having a light-absorbing property.

14. The substrate according to claim 13, wherein each of the TFTs has a channel region and a LDD region;
and wherein the fourth light-shielding layer has first parts covering the channel regions of the TFTs and second parts covering the LDD regions thereof.

15. The substrate according to claim 13, wherein the fourth light-shielding layer is made of a material including silicon.

16. The substrate according to claim 13, wherein the fourth light-shielding layer has conductivity; the fourth light-shielding layer having a structure that allows application of a constant voltage.

17. The substrate according to claim 13, wherein the fourth light-shielding layer has conductivity and is connected electrically to the gate lines.

18. The substrate according to claim 13, wherein the fourth light-shielding layer is made of silicon doped with an impurity.

19. The substrate according to claim 13, wherein the gate lines are arranged in such a way as to overlap with the channel regions of the corresponding TFTs;
and wherein the gate lines have a function of gate electrodes of the TFTs at their overlapping parts.

20. The substrate according to claim 13, wherein gate electrodes are formed for the respective TFTs separately from the gate lines;
and wherein the gate lines are electrically connected to the corresponding gate electrodes.

21. The substrate according to claim 13, further comprising a patterned second light-shielding layer formed between the first light-shielding layer and the TFTs;
wherein the second light-shielding layer has a light-absorbing property.

22. The substrate according to claim 21, wherein a dielectric sandwiched by the second light-shielding layer and the active layers of the TFTs has a thickness ranging from 100 nm to 500 nm.

23. The substrate according to claim 21, wherein a dielectric sandwiched by the second light-shielding layer and the active layers of the TFTs has a thickness ranging from 150 nm to 300 nm.

24. The substrate according to claim 21, wherein a driver circuit section including TFTs is provided in addition to a pixel matrix section where the TFTs are arranged in a matrix array;
and wherein the second light-shielding layer is provided for the TFTs in the pixel matrix section while the second light-shielding layer is not provided for the TFTs in the driver circuit section.

25. An active-matrix addressing LCD device comprising:
(a) a TFT array substrate according to claim 13;
(b) an opposite substrate located to be opposite to the TFT array substrate; and
(c) a liquid-crystal layer formed between the TFT array substrate and the opposite substrate.

* * * * *